(12) United States Patent
Park

(10) Patent No.: US 6,897,621 B2
(45) Date of Patent: May 24, 2005

(54) THREE-TERMINAL ORGANIC ELECTRO-LUMINESCENT DEVICE

(76) Inventor: Byoung Choo Park, 101-602 Daejin-1cha Apt., Jukjeon-ri, Suji-eup, Yongin-city, Kyonggi-do 449-752 (KR)

( * ) Notice: Subject to any disclaimer, the term of this patent is extended or adjusted under 35 U.S.C. 154(b) by 0 days.

(21) Appl. No.: 10/725,645

(22) Filed: Dec. 2, 2003

(65) Prior Publication Data

US 2004/0108807 A1 Jun. 10, 2004

Related U.S. Application Data

(63) Continuation of application No. PCT/KR02/00103, filed on Jan. 21, 2002.

(30) Foreign Application Priority Data

Jun. 8, 2001 (KR) .................................... 2001-0032045
Oct. 23, 2001 (KR) .................................... 2001-0065442

(51) Int. Cl.[7] ............................................... G09G 3/10
(52) U.S. Cl. ..................... 315/169.3; 313/504; 313/506
(58) Field of Search ........................... 315/169.3, 169.4, 315/169.1; 313/504–506, 498, 509

(56) References Cited

U.S. PATENT DOCUMENTS 6,084,579 A * 7/2000 Hirano .................... 315/169.3
6,140,766 A   10/2000 Okada et al. .............. 313/506
6,559,594 B2 * 5/2003 Fukunaga et al. ........ 313/506
6,836,067 B1 * 12/2004 Imai ........................ 313/504
2002/0033664 A1 * 3/2002 Kobayashi ................. 313/504

FOREIGN PATENT DOCUMENTS

JP          10-092583       4/1998
JP          10-125471       5/1998

* cited by examiner

*Primary Examiner*—Don Wong
*Assistant Examiner*—Ephrem Alemu
(74) *Attorney, Agent, or Firm*—St. Onge Steward Johnston & Reens LLC

(57) ABSTRACT

A three-terminal organic electro-luminescent (EL) device is disclosed for achieving increased efficiency, decreased turn-on voltage, and increased brightness. The three-terminal organic EL device has a first electrode formed on a substrate, at least one organic material layer including an organic light-emitting layer formed on the first electrode, a second electrode formed on the organic material layer; and at least one third electrode formed on or inside said organic material layer. The third electrode is formed outside of a region, which is between the first electrode and the second electrode to prevent a reduction of luminescent area. The luminance of the organic EL device is controlled by adjusting potential of the third electrode with respect to the potentials of the first electrode and the second electrode.

13 Claims, 21 Drawing Sheets

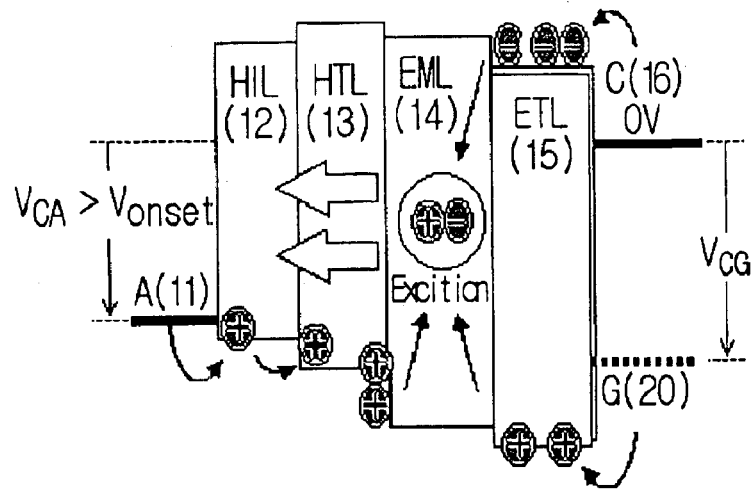
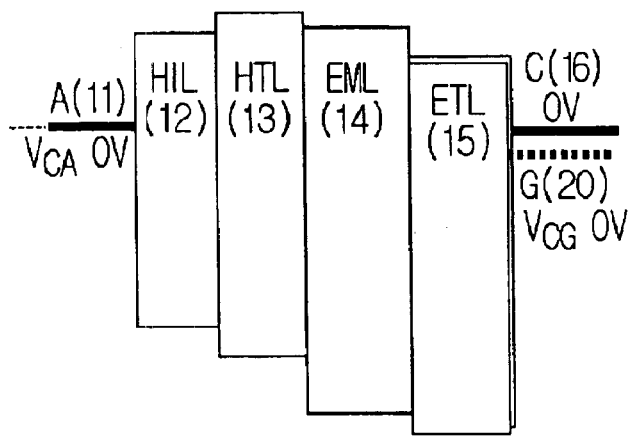
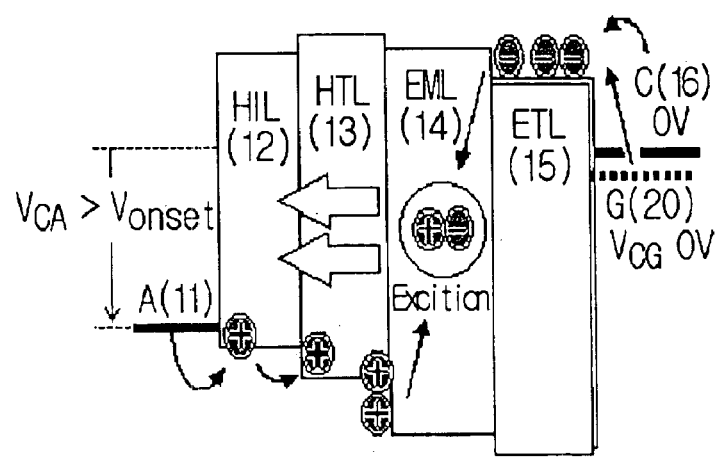

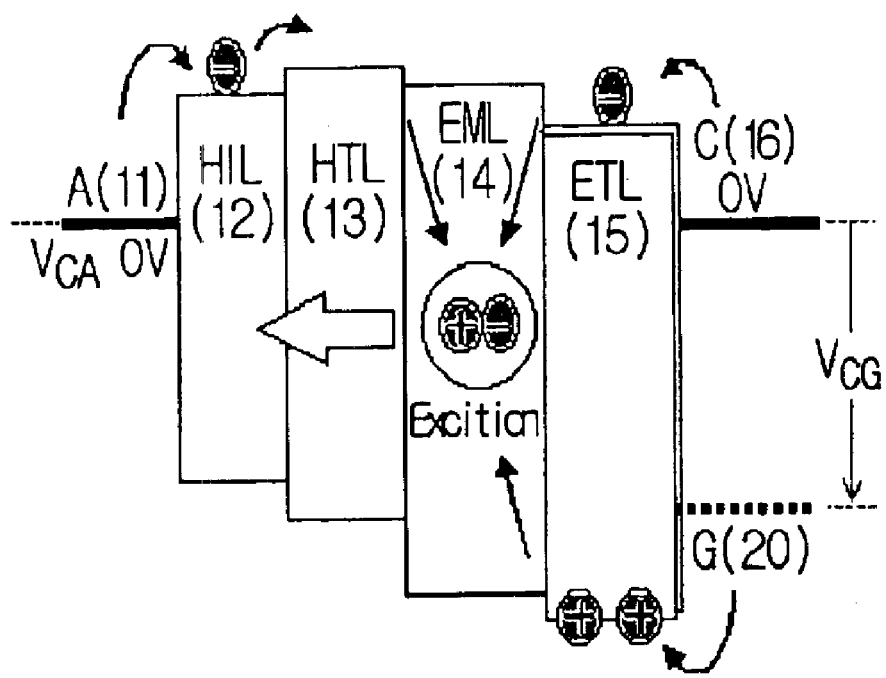
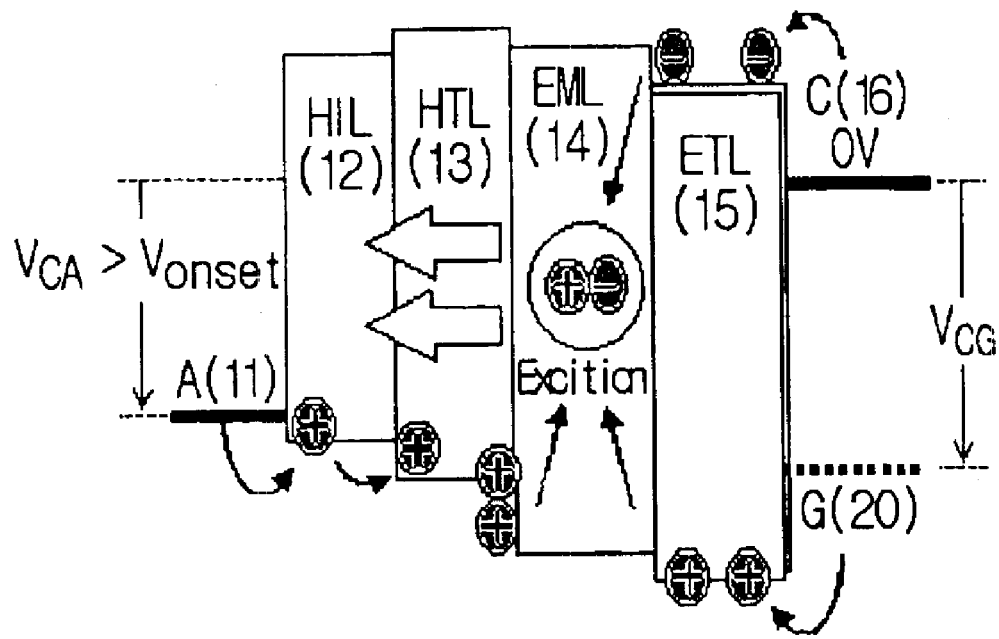

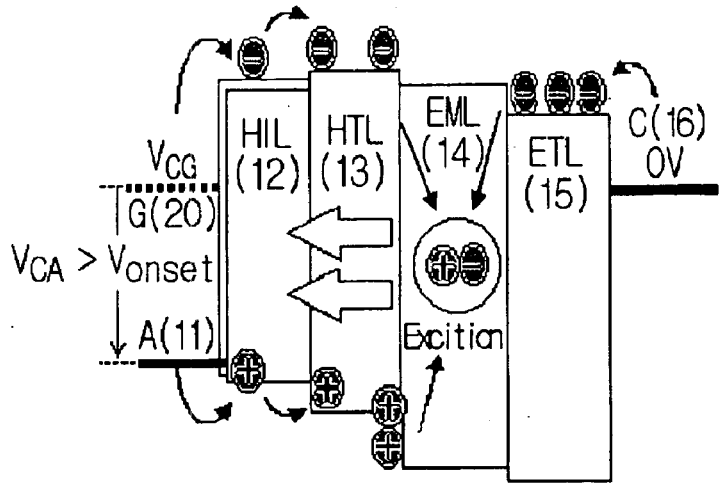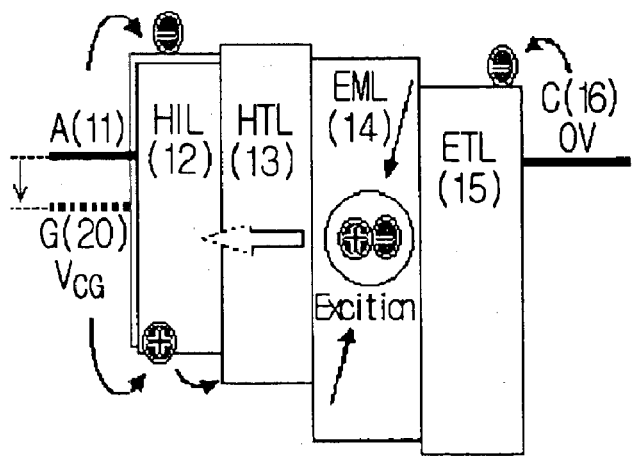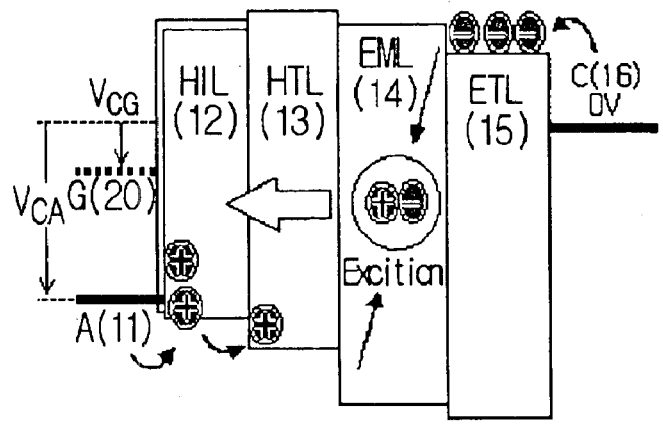

THREE-TERMINAL ORGANIC ELECTRO-LUMINESCENT DEVICE

CROSS-REFERENCES TO RELATED APPLICATIONS

This application is a continuation of pending International Patent Application No. PCT/KR02/00103 filed Jan. 21, 2002, which designates the United States and claims priority of pending Korean Patent Application No. 2001-0032045 filed on Jun. 8, 2001 and Korean Patent Application No. 2001-0065442 filed on Oct. 23, 2001 in the Korean Intellectual Property Office, the disclosure of which are incorporated herein their entirety by reference.

BACKGROUND OF THE INVENTION

1. Field of the Invention

The present invention relates to a three-terminal organic electro-luminescent (EL) device having organic and/or polymeric materials as the luminescent semi-conductive species with a third electrode besides an anode and a cathode and, more particularly, to a three-terminal organic EL device resulting in light-emitting triode (or transistor) structures with increased efficiency, decreased turn-on voltage, and increased brightness, thereby easily controlling a luminance of a pixel in the organic EL device.

2. Description of the Related Art

Considerable progress has been made in organic electroluminescent (EL) diodes utilizing organic and/or polymeric materials as the luminescent semi-conductive species ever since Tang and VanSlyke demonstrated efficient electroluminescence from organic molecular materials in 1987 (C. W. Tang and S. A. VanSyke, Appl. Phys. Lett. 51, 913 (1987)). Their EL diode devices emphasized a bilayer structure in which an additional hole transport layer of an aromatic diamine was provided to balance the transport of electrons in the light-emitting layer of tris (8-quinolinolato) aluminum ($Alq_3$), resulting in high efficiency and luminance more than 1000 $cd/m^2$ at low drive voltages less than 10V DC. Remarkable progress in a green EL diode has been developed so that an initial luminance of 300 $cd/m^2$ and a half decay time of more than 10000 hours are achieved. Recently, research and development in the area of the organic EL diode device has been extending its focus, not only to the emitting mechanism and materials for obtaining high efficiency, long lifetime, and full-color emissions, but also to the peripheral technologies in search for flat panel display application.

Parallel to developments made with low-weight molecular film devices, there have been constant efforts to discover macromolecular polymeric materials for polymeric EL diode devices and to understand the mechanism of device operation (J. H. Burroughes, D. D. C. Bradly, A. R. Brown, R. N. Marks, K. Mackay, R. H. Friend, P. L. Burns, and A. B. Holmes, Nature 347, 539 (1990)). Conjugated polymers, such as poly (phenylene-vinylene) (PPV) and its derivatives with high luminescence efficiency, have enormous advantages when used for fabricating EL diode device, combining the good charge transport property with the desirable structural properties of polymers. Studies of the charge transport in PPV reveal that the bulk conduction properties, i.e., carrier mobilities, play an important role in the device characteristics. Nonconjugated polymers have also been shown to be useful in fabricating EL diode. For example, although poly (N-vinylcarbazole) (PVK) is not electronically conductive, it shows photoconductivity and has relatively high hole drift mobilities due to its carbazole side groups.

For details on recent progress in various organic EL diode devices, see examples, the followings:

C. W. Tang and S. A. Van Syke, Appl. Phys. Lett. 51, 913 (1987); C. W. Tang, S. A. Van Syke, and C. H. Chen, J. Appl. Phys. 65, 3610 (1989); C. Adachi, S. Tokito, T. Tetsui, and S. Saito, Appl. Phys. Lett. 55, 1489 (1989); C. Adachi, S. Tokito, T. Tetsui, and S. Saito, Appl. Phys. Lett. 56, 799 (1989); J. H. Burroughes, D. D. C. Bradly, A. R. Brown, R. N. Marks, K. Mackay, R. H. Friend, P. L. Burns, and A. B. Holmes, Nature 347, 539 (1990); D. Braun and A. J. Heeger, Appl. Phys. Left. 58, 1982 (1991); W. Tachelet, S. Jacobs, H. Ndayikengurukiye, H. J. Geise, and J. Gruner, Appl. Phys. Left. 64, 2364 (1994); J. Kido, K. Hongawa, K. Okuyama, and K. Nagai, Appl. Phys. Left. 63, 2627 (1993); G. Gustaffson, Y. Cao, G. M. Treacy, F. Klavetter, N. Colaneri, and A. J. Heeger, Nature (London) 357, 477 (1992); Y. -E. Kim, H. Park, and J. -J. Kim, Appl. Phys. Lett. 69, 599 (1996); H. H. Kim, T. M. Miller, E. H. Westerwick, Y. O. Kim, W. Kwock, M. D. Morris, and M. Cerullo, J. Lightwave Technol. 12, 2107(1994); F. Li, H. Tang, J. Anderegg, and J. Shinar, Appl. Phys. Lett. 70, 1233 (1997); and L. S. Hung, C. W. Tang, and M. G. Mason, Appl. Phys. Lett. 70, 152 (1997).

The organic EL diode device has not only a fast response time of several microseconds but also an excellent brightness of self-emission with wide viewing angle under a low driving voltage. In particular, the organic EL device can be easily manufactured in a thin film and a flexible form. Also, the organic EL device has an advantage to be able to emit light in a wide visible spectral range. Thus, due to their wide viewing angle, bright self-emission, and ease of color tunability and processability, displays based on the organic EL diode such as transparent organic EL diode, flexible organic EL diode, stacked organic EL diode, microcavity organic EL diode, and inverted organic EL diode have become promising candidates for a flat panel display instead of a liquid crystal display (LCD), a plasma display panel (PDP) or a field emission display (FED).

Cross sectional views of a conventional organic EL diode device were shown in FIGS. 1a and 1b. As shown in FIG. 1a, a first electrode 11 serving as an anode (A), composed of Indium Tin Oxide (ITO), polyaniline or Ag having large work function, is formed on a substrate 10. At least one first organic material layer 22 composed of low molecular weight organic compounds and/or polymer materials is formed on the first electrode 11. A second organic material layer 26 composed of another low molecular weight organic compounds and/or polymer materials is formed on the first organic material layer 22. And at least one light-emitting layer is included in either the first organic material layer 22 or the second organic material layer 26, or interposed therebetween. A second electrode 16 serving as a cathode (C), composed of Al, Mg, Li, Ca, or complex compounds thereof having low work function is formed on the second organic material layer 26, while opposing the first electrode 11.

The first organic material layer 22 and the second organic material layer 26, as shown in FIG. 1b, may include a hole injection layer 12 for injecting holes, a hole transporting layer 13 for conveying holes, an organic light-emitting layer 14 and an electron transporting layer 15 for injecting and conveying the electrons, which are sequentially formed. Here, the electron transporting layer 15 may include a hole blocking layer and an electron injection layer.

When a voltage is applied between the first electrode 11 and the second electrode 16 of the organic EL diode device shown in FIGS. 1a and 1b, the holes injected from the first electrode 11 migrate through the hole injection layer 12 and the hole transporting layer 13 into the organic light-emitting layer 14, and the electrons injected from the second electrode 16 migrate into the organic light-emitting layer 14 through the electron transporting layer 15. Thereafter the recombination of the injected holes and electrons at the organic light-emitting layer 14 excites the emitting centers, thereby emitting EL lights and displaying images. This radiative recombination luminance is directly proportional to the concentrations of charge carriers and the electron-hole radiative recombination probability at the organic light-emitting layer 14.

With reference to potential diagrams for energy band structure shown in FIG. 1c, a radiation principle of the organic EL diode can be explained. The electron is symbolized as a circled "−" (⊖), the hole is symbolized as a circled "+" (⊕) and migration of the electron and hole is represented as an arrow. The reference numerals 11, 12, 13, 14, 15, and 16 appeared in FIG. 1c mean energy potentials of the anode (A) 11, the hole injection layer (HIL) 12, the hole transporting layer (HTL) 13, the organic light-emitting layer (EML) 14, the electron transporting layer (ETL) 15, and the cathode (C) 16, respectively. Also, $\phi_A$ and $\phi_C$ indicate work functions of the anode (A) 11 and the cathode 16 (C), respectively, while EA and IP indicate the electron affinity and the ionization potential of each organic layer, respectively. HOMO and LUMO represent the highest occupied molecular orbital (valance band) and lowest unoccupied molecular orbital (conduction band) of the organic layers.

First, when a voltage ($V_{CA}$) is not applied between the anode (A) 11 and the cathode (C) 16, the hole injection layer 12, the hole transporting layer 13, the organic light-emitting layer 14 and the electron transporting layer 15 are in thermodynamic equilibrium state so that Fermi levels thereof are identical to each other, as shown in D1 of FIG. 1c. When the voltage $V_{CA}$ is applied between the anode (A) 11 and the cathode (C) 16, the holes are gradually injected from the anode (A) 11 into the highest occupied molecular orbital (HOMO) state of the hole injection layer 12 and the electrons are gradually injected from the cathode (C) 16 into the lowest unoccupied molecular orbital (LUMO) state of the electron transport layer 15. Here, if the applied voltage $V_{CA}$ is less than a turn-on voltage ($V_{ONSET}$), then the holes and the electrons cannot migrate to the organic light-emitting layer 14 and there is no occurrence of electro-luminescence, as shown in D2 of FIG. 1c. However, if the applied voltage $V_{CA}$ is exceeds the turn-on voltage $V_{ONSET}$, then the holes and the electrons can migrate into the organic light-emitting layer 14 through the HIL (12), HTL (13), and ETL (15). And electro-luminescence can be generated from the radiative recombination of the holes and the electrons (exciton) in EML (14) ($S_1$->$S_0$+hv), as shown in D3 of FIG. 1c. In this case, the current flows of anode ($I_A$) and cathode ($I_C$) can be written as $I_A=I_C$. Thus, the electro-luminance is directly proportional to the electron-hole radiative recombination probability and concentrations of injected electrons and holes at the organic light-emitting layer 14.

One of techniques for controlling a luminance in the conventional two-terminal organic EL diode device was disclosed in Korean Laid-Open publication 2001-14600. FIG. 2 illustrates an active matrix type organic EL display having red (R), green (G), and blue (B) pixels disclosed in Korean Laid-Open publication 2001-14600 and FIG. 3 illustrates a voltage adjusting circuit for controlling the luminance of the pixels.

Referring to FIG. 2, each pixel has an anode (A) 11, R, G, and B light-emitting layers 14, and a cathode (C) 16. The anode (A) 11 is connected to a source electrode of a polysilicon thin film, which forms a thin film transistor (TFT) 40 together with a drain electrode of the polysilicon thin film 41 and a gate electrode 39. The drain electrode is connected to a power supply terminal 32. A power supply voltage $V_{DD}$ for driving the organic EL display is connected to the power supply terminal 32 and the cathode (C) 16 is grounded. When the gate electrode 39 is turned on, the power supply voltage $V_{DD}$ is supplied to the anode (A) 11 and the pixels emit light by the voltage between the anode (A) 11 and the cathode (C) 16. The undescribed reference numerals 44 and 10 represent an interlayer dielectric and a substrate, respectively.

The voltage adjusting circuit in FIG. 3 controls the power supply voltage $V_{DD}$ applied to the anode (A) 11 according to the current amount introduced to the cathode (C) 16. If many pixels emit EL light, for example all of R, G, and B pixels in FIG. 2 radiate, the current amount flowing into the cathode (C) 16 is increased. Thereby, voltage V1 in a current detection circuit 52 rises and an output voltage V2 of an inverted-voltage amplification circuit 54 descends. The descended voltage V2 is amplified at an amplification circuit 56 and in turn the amplified voltage is supplied to the power supply terminal 32. On the contrary, if few pixels emit EL light, for example only one of R, G, and B pixels in FIG. 2 radiate, the current amount flowing into the cathode (C) 16 is decreased. Thereby, the voltage V1 in a current detection circuit 52 descends and the output voltage V2 of the inverted-voltage amplification circuit 54 increases. Therefore the high voltage $V_{DD}$ is supplied to the power supply terminal 32.

That is, the voltage adjusting circuit in FIG. 3 reduces a luminance of each pixel and thus degrades luminance of the organic electro-luminescent display in case where many pixels emit EL light, and enhances the luminance of the organic EL display and degrades the luminance thereof in case where few pixels radiate.

The adjustment of the luminance using the circuit in FIG. 3 needs an accurate and precise control for the current and voltage between the anode 11 and the cathode 16. Thus, the method for adjusting the luminance described above, is more complicate than that employed in another flat panel display such as a liquid crystal display (LCD).

Beside of the complexity for adjusting the luminance, the organic EL diode devices suffer three important drawbacks that impede large-scale applications:
(1) Emission of light at the desired brightness levels often requires the application of a relatively high voltage.
(2) The external conversion efficiency is low.
(3) Brightness is limited, particularly at voltage below 5 volts.

Therefore, general and broad needs still exist for device concepts that result in light-emitting structure with increased efficiency, decreased turn-on voltage, and increased brightness.

SUMMARY OF THE INVENTION

It is an object of the present invention to provide a three-terminal organic EL device, easily realizing an organic EL device having increased efficiency, decreased turn-on voltage, and increased brightness.

It is another object of the present invention to provide a three-terminal organic EL device having improved image quality and reliable operation property.

In order to accomplish the above objects, three electrodes are incorporated into light-emitting devices to provide a three-terminal organic electro-luminescent (EL) device.

The three-terminal organic EL device comprises a substrate, a first electrode formed on the substrate, at least one organic material layer including an organic light-emitting layer formed on the first electrode, a second electrode formed on the organic material layer, and at least one third electrode. The third electrode, which is main feature of the present invention, is formed on or inside the organic material layer, to control the flows of charge carriers and the emitting EL light. Especially, in the three-terminal organic EL device of the present invention, the third electrode is preferably formed outside of a region, which is defined between the first electrode and the second electrode. This structure is similar to the structure of top gate static induction transistor (or triode), which can be operated at higher current and voltage levels than a lateral field-effect transistor (FET) device.

The third electrode is made of a conductive organic material, a conductive inorganic material, a metal or complex thereof and preferably one selected from a group consisting of ITO, Ag, Al, Mg, Ca, Li, or compound thereof (Mg:Ag, Mg:Ag—Li, Al:Li). Further, the third electrode may be encapsulated by an insulating material.

The three electrodes are electronically connected to external circuits such that voltages can be applied to the three electrodes, and currents can be drawn in the circuits, either positive or negative, among the three electrodes so as to function as a three-terminal triode. In this device, the electron and hole currents flowing between the first and second electrodes can be controlled and balanced by applying bias voltage of the third electrode. Moreover, the third electrode can enhance the local electric field between the first and second electrodes, resulting in increasing charge carrier injection into the organic light-emitting layer so that electro-luminance of the organic EL device according to the present invention could be easily controlled with increased efficiency, decreased turn-on voltage ($V_{ONSET}$), and increased brightness.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or the similar components, wherein:

FIG. 5 is one example of the three-terminal organic EL device in FIG. 4a;

DETAILED DESCRIPTION OF THE DRAWINGS

Preferred embodiments of this invention will be explained with reference to the accompanying drawings.

Figure 1A:
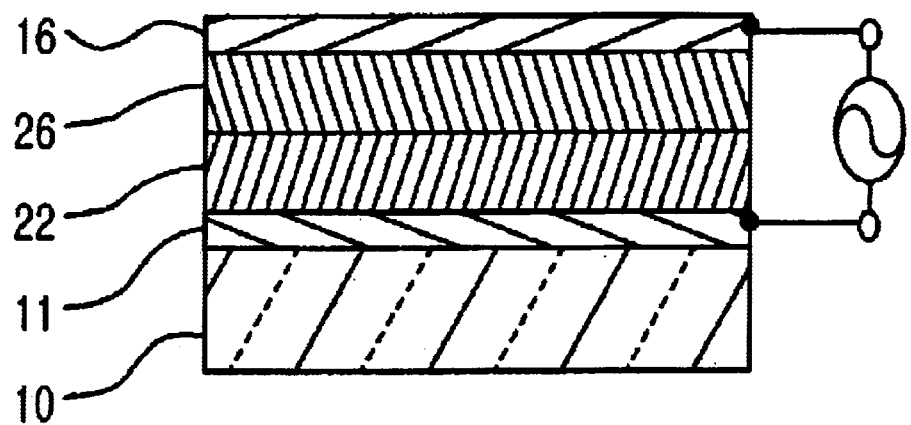
FIGS. 1a and 1b are schematic, not-to-scale cross sectional views of a conventional two-terminal organic EL device.
Figure 1B:
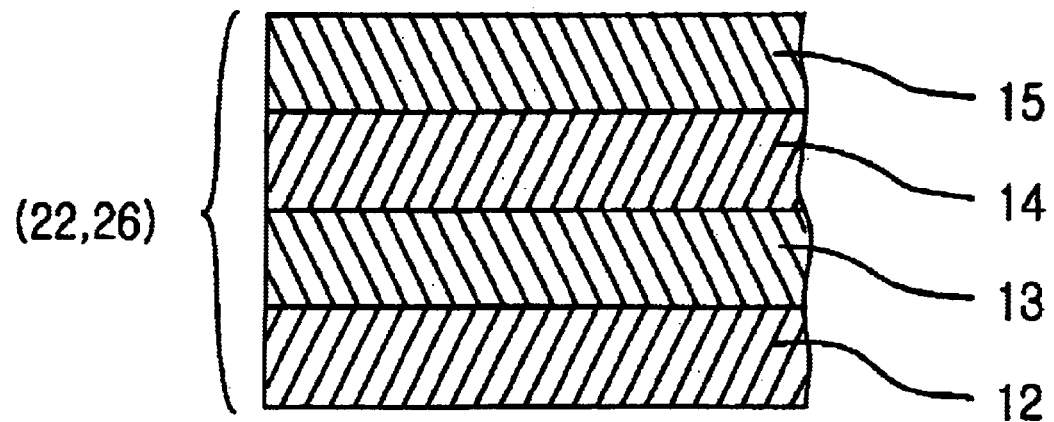
Figure 1C:
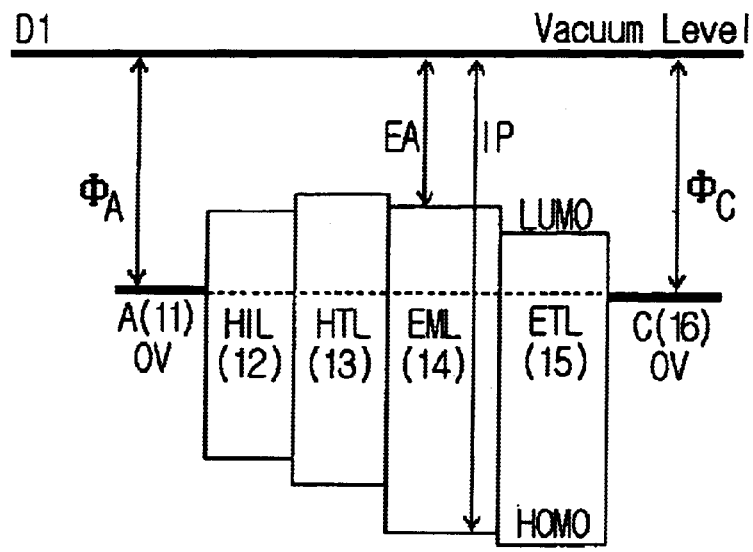
FIG. 1c shows electronic potential diagrams of energy band structure to describe electro-luminescence principle of the conventional two-terminal organic EL diode.
Figure 1C:
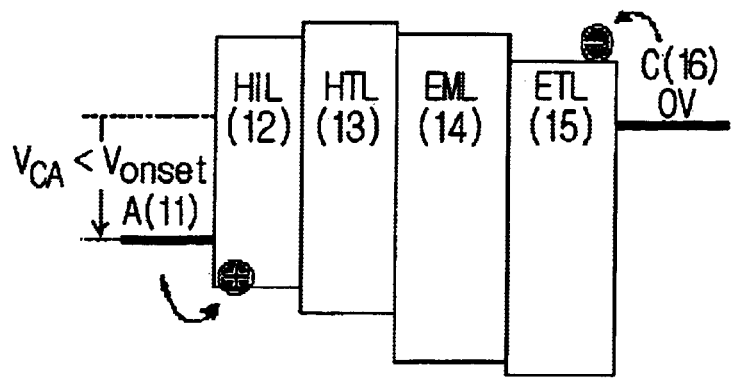
Figure 1C:
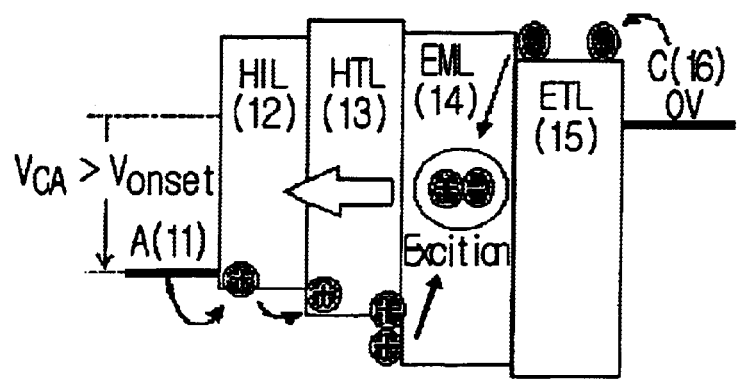
Figure 2:
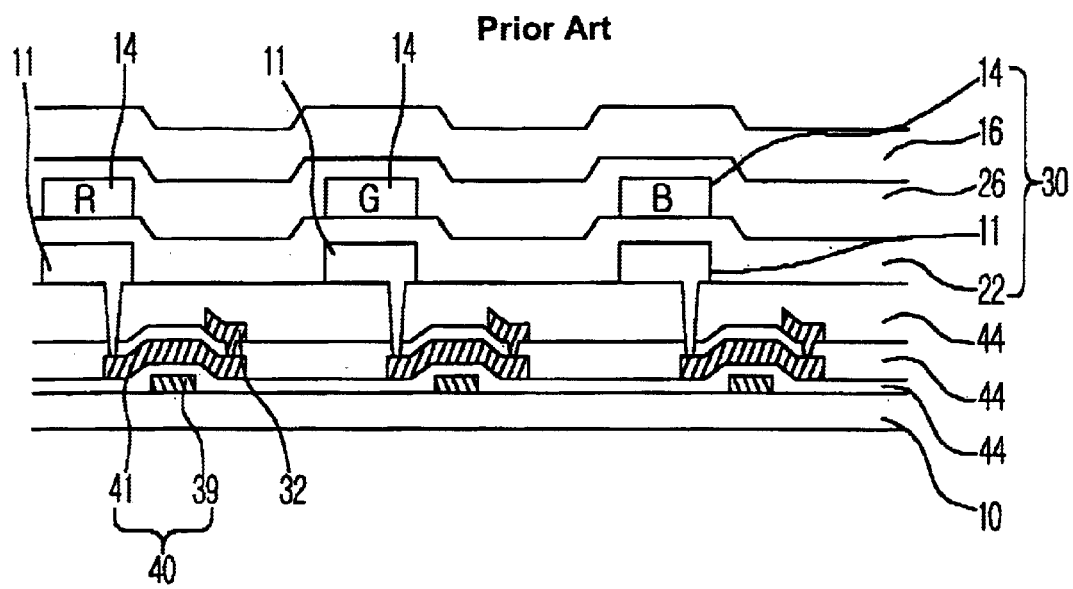
FIG. 2 shows a cross sectional view illustrating R, G, and B pixels of an organic electro-luminescent display having conventional two-terminal organic EL diodes in FIG. 1.
Figure 3:
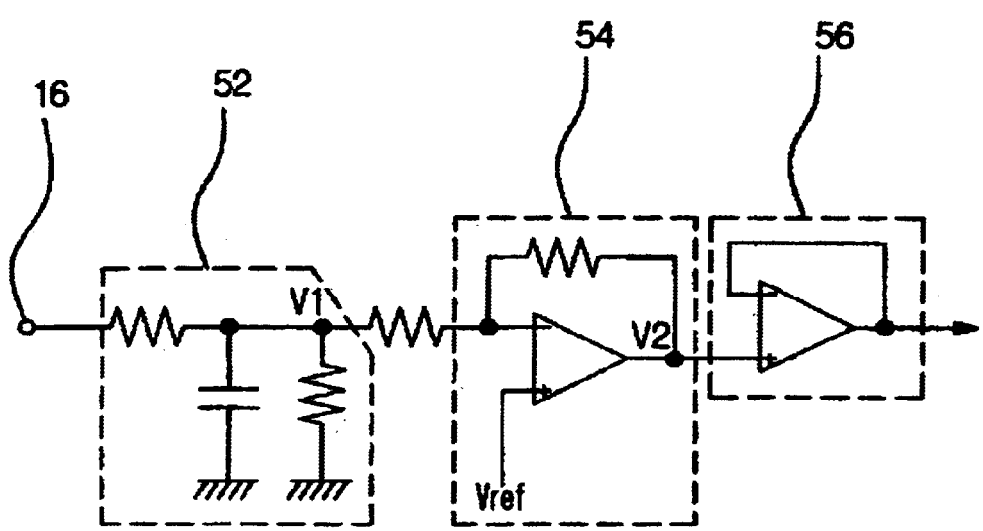
FIG. 3 is a current adjustment circuit for controlling a luminance of the conventional two-terminal organic EL diode in FIG. 1.
Figure 4A:
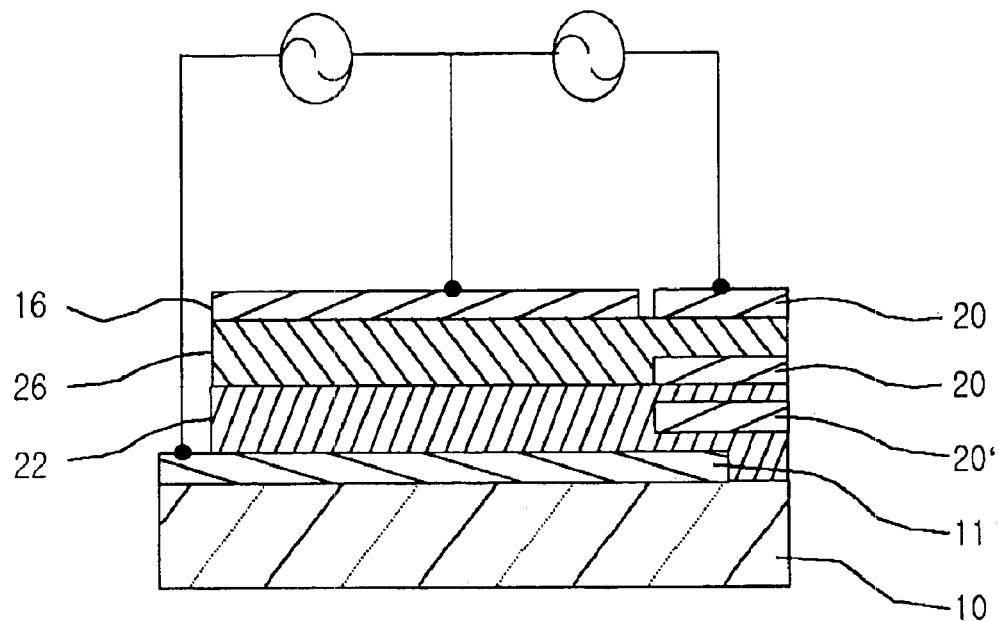
FIG. 4a illustrates a schematic, not-to-scale cross sectional view of one embodiment of a three-terminal organic EL device according to the present invention.
Figure 4B:
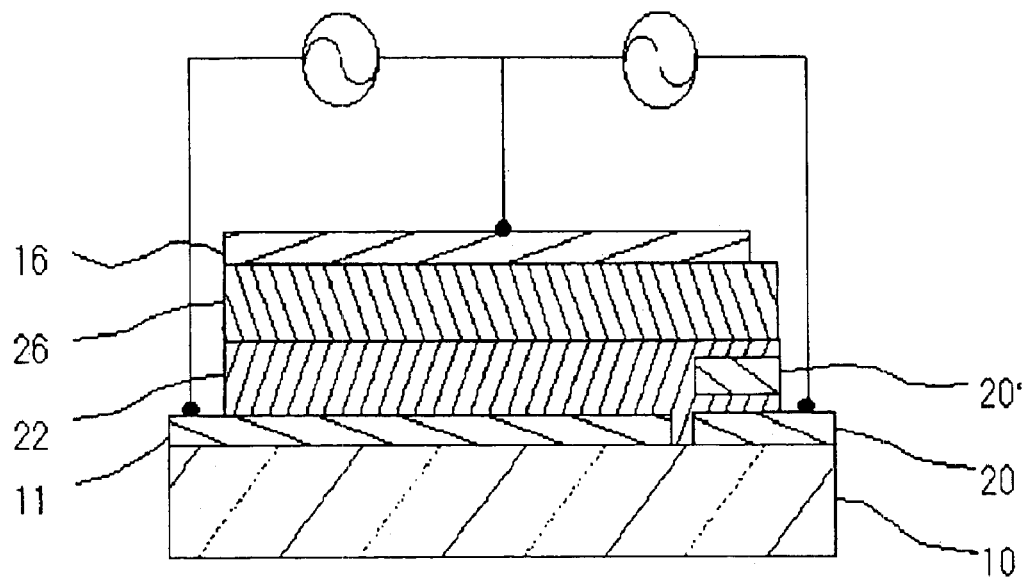
FIG. 4b illustrates a schematic, not-to-scale cross sectional view of the other embodiment of a three-terminal organic EL device according to the present invention.

The structure of a representative three-terminal organic EL device is set forth in FIGS. 4a and 4b. FIG. 4a illustrates a schematic, not-to-scale cross sectional view of three-terminal organic EL device according to one embodiment of the present invention. The three-terminal organic EL device in FIG. 4a has a first electrode (anode, A) 11 formed on the substrate 10, a first organic material layer 22, a second organic material layer 26, and a second electrode (cathode, C) 16 formed on the second organic material layer 26 with opposing the first electrode (anode, A) 11, like the two-terminal organic EL device in FIG. 1a. Further, the three-terminal organic EL device comprises a third electrode (gate, G) 20 which is formed on the organic material layer 22 or 26, or a third electrode (gate, G) 20' which is formed inside the organic material layer 22 or 26 as shown in FIG. 4a. Wherein, the first organic material layer 22 and the second organic material layer 26 include the hole injection layer 12, the hole transporting layer 13, the organic light-emitting layer 14 and the electron transporting layer 15, like FIG. 1b. The three electrodes (11, 16 and 20 or 20') are connected to external circuits for driving the EL triode device. That is, the first electrode 11 serves as the anode (A) for injecting holes into the first organic material layer 22, the second electrode 16 serves as the cathode (C) for injecting electrons into the second organic material layer 26 and the third electrode 20 or 20' plays a role of a gate (G) to control the flows of holes and electrons.

FIG. 4b illustrates a schematic, not-to-scale cross sectional view of three-terminal organic EL device according to another embodiment of the present invention. The three-terminal organic EL device in FIG. 4b also has a first electrode (anode, A) 11 formed on the substrate 10, a first organic material layer 22, a second organic material layer 26 and a second electrode (cathode, C) 16 formed on the second organic material layer 26 with opposing the first electrode 11, like the two-terminal organic EL device in FIG. 1a. Further, the three-terminal organic EL device comprises a third electrode (gate, G) 20 which is formed under the first organic material layer 22 or a third electrode 20' which is formed inside the first organic material layer 22 as shown in FIG. 4b. Wherein, the first organic material layer 22 and the second organic material layer 26 include the hole injection layer 12, the hole transporting layer 13, the organic light-emitting layer 14 and the electron transporting layer 15, like FIG. 1b. The three electrodes (11, 16 and 20 or 20') are connected to external circuits for driving the EL device. That is, the first electrode 11 serves as an anode (A) for injecting holes into the first organic material layer 22, the second electrode 16 serves as the cathode (C) for injecting electrons into the second organic material layer 26 and the third electrode 20 or 20' plays a role of a gate electrode to control the flows of holes and electrons.

In the three-terminal organic EL devices of the present invention, the injected holes and electrons from the first and the second electrodes into the light-emitting layer 14 through the first organic material layer 22 and the second organic material layer 26 can be controlled by adjusting a bias potential of the third electrode (G) 20 or 20' with respect to the potentials of the anode (A) and the cathode (C), thereby easy controlling luminance of the organic EL device. Moreover, the additive holes or electrons can be injected from the third electrode (G) 20 or 20' into the light-emitting layer 14 through the first organic material layer 22 or the second organic material layer 26. Accordingly, the additive holes or electrons injected from the third electrode (G) 20 or 20' are recombined at the light-emitting layer 14, thereby enhancing luminance of the organic EL device.

The position of the third electrode (G) 20 or 20' is not limited so far as it can control the hole and/or the electron currents inside the organic material layers 22 and 26. Preferably, the third electrode (G) 20 or 20' may be formed outside of region, which is defined between the anode (A) 11 and the cathode (C) 16, as shown in FIGS. 4a and 4b. If the third electrode (G) 20 or 20' is formed within region between the anode (A) 11 and the cathode (C) 16 in porous network or grid forms, it is possible to control the luminance of the organic EL device. However, the third electrode (G) 20 or 20' may shield an electric field between the anode (A) 11 and the cathode (C) 16 so that the injection and transportation of the charge carriers are obstructed and then light-emitting active area may be reduced seriously. Accordingly, preferably the third electrode (G) 20 or 20' is formed outside of region, which is defined between the anode (A) 11 and the cathode (C) 16, to overcome the above problems.

In case where the third electrode 20 in FIGS. 4a and 4b is employed in the three-terminal organic EL device according to the present invention, a distance between the second electrode 16 and the third electrode 20 in FIG. 4a and a distance between the first electrode 11 and the third electrode 20 in FIG. 4b must be provided to avoid shorted-circuit and should be less than 1 mm to prevent an operation disabling. The thickness of the third electrode (G) 20 or 20' is not specifically restricted and preferably less than 2000 nm. The total thickness of the organic material layers between the anode (A) 11 and the cathode (C) 16 is preferably less than 5000 nm.

The organic light-emitting layer 14 can be made of various conventional chemical compound used in manufacturing organic EL diode device and preferably can be made of organic monomer, oligomer, or polymer which is conductive, non-conductive, or semi-conductive. The organic monomer may be tris (8-quinolinolato)aluminum ($Alq_3$), 10-benzo [h] quinolinol-beryllium complex ($BeBq_2$) or tris (4-methyl-8-quinolinolate)aluminum (Almq), which emits light in green color region (540–550 nm). The blue-emitting layer for the organic light-emitting layer 14 is made of metal complex such as Balq (Bis(2-methyl-8-quinolinolato)(para-phenyl-phenolato)aluminum), or of non-metal complex such as strylarylene-based derivatives DPVBi (1,4-bis(2,2'-diphenyl-vinyl)biphenyl), oxadiazole-based derivatives, bisstrylanthrancene-based derivatives, bisstrylanthracene-based derivatives such as BczVBi (4,4'-Bis((2-carbazole)vinylene)biphenyl), or α-NPD (4,4'bis[N-(1-napthyl-N-phenyl-amino)biphenyl]). The red-emitting layer for the organic light-emitting layer 14 is made of [2-methyl-6-[2-(2,3,6,7-tetrahydro-1H, 5H-benzo[ij] quinolizin-9-yl)ethenyl]-4H-pyran-4-ylidene]propane-dinitrile, (DCM2). Dopant for high luminescent efficiency such as N,N-dimethylquinacridone (DMQA) or quinacridone (QAD) can be added to the organic light-emitting layer 14 to enhance the luminance and the endurance of the organic EL device. Known luminescent polymer such as PPP (poly (p-phenylenylene) or PPV (poly(phenylene vinylene) can be also used as the green emissive materials for the organic light-emitting layer 14. Poly(2-methoxy-5 (2'-ethyl-hexoxy)-p-phenylene vinylene) (MEH-PPV) and Polyfluorene (PF) can be also used as the red and blue emissive polymeric materials, respectively, for the organic light-emitting layer 14.

The hole injection layer 12 and the hole transporting layer 13 which are formed at need, are used so as to facilitate injection of holes from the anode 11, transport safely holes and block electrons. Tri(phenyldiamine) derivatives, strylamine derivatives or amine derivatives having fused aromatic ring, etc. may be used as the hole injection layer 12 and the hole transporting layer 13. 4,4',4"-tris[3-methylphenyl (phenyl)amino]triph-enylamine (m-MTDATA) or copper pthalocyanine (CuPc) can be used for hole injection layer and N-N'-diphenyl-N-N"bis(3-methylphenyl)-[1-1'-biphenyl]-4-4'-diamine (TPD) or α-NPD (4,4'bis[N-(1-napthyl-N-phenyl-amino)biphenyl]) can be used for hole transport layer. The electron transporting layer 15, facilitating injection of electrons from the cathode 16, transporting safely electrons to the organic light-emitting layer 14 and blocking holes, may be made of quinoline derivatives such as $Alq_3$.

That is, the hole injection layer 12, the hole transporting layer 13 and the electron transporting layer 15 improve the luminescent efficiency of the organic EL device by increasing the numbers of the holes and the electrons flowing into the organic light-emitting layer 14 and coupling them for recombination (exciton). The thickness of the hole injection layer 12, hole transporting layer 13 and the electron transporting layer 15 is not specifically defined and is dependent on the manufacturing method, and in general 5 nm through 800 nm.

The anode 11 for injecting holes, may be made of ITO, polyaniline or Ag, which has relatively high work function. The cathode 16 for injecting electrons, may be made of Al, Mg, Li, Ca, or complex compound thereof, which has relatively low work function. And the substrate can be made of transparent material such as glass or flexible polymer film or semiconductor such as silicon or gallium arsenide.

The third electrode (G) 20 or 20' is made of a conductive organic material such as a conductive organic monomer or a conductive oligomer, or conductive inorganic material metal or a complex thereof. Preferably, the third electrode (G) 20 or 20' can be made of one selected from a group consisting of ITO, Ag, Al, Mg, Ca, Li and complex compound thereof. The third electrode (G) 20 or 20' can be covered with an insulating layer made of insulating material so as to block the current flow between the anode (A) 11 and the third electrode (G) 20 or 20', or between the cathode (C) 16 and the third electrode (G) 20 or 20'.

The third electrode 20 or 20' is connected to an external circuit so as to have positive or negative potential with respect to the anode (A) and the cathode (C). The potential of the third electrode (G) 20 or 20' adjusts the flow of holes and electrons into the organic light-emitting layer 14, thereby controlling the luminance of the organic EL device.

Figure 4C:
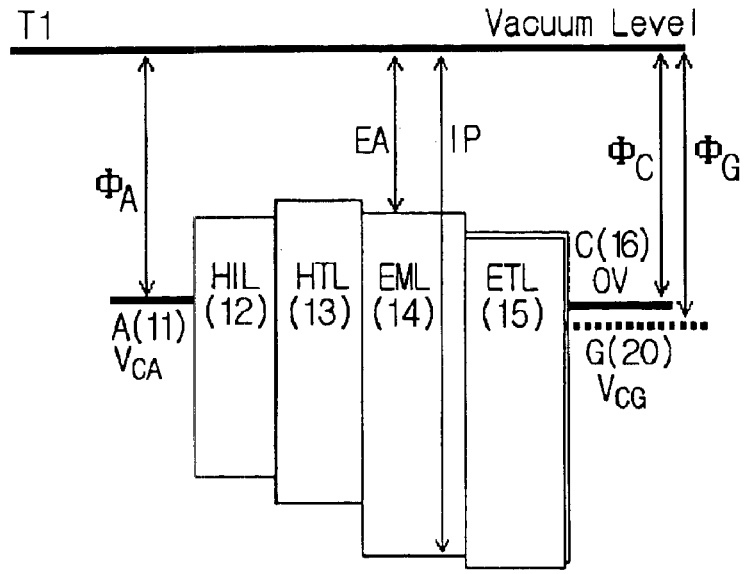
FIGS. 4c and 4d depict electronic potential diagrams of energy band structure to describe luminescence principle of a three-terminal organic EL device in FIG. 4 according to the present invention.
Figure 4C:
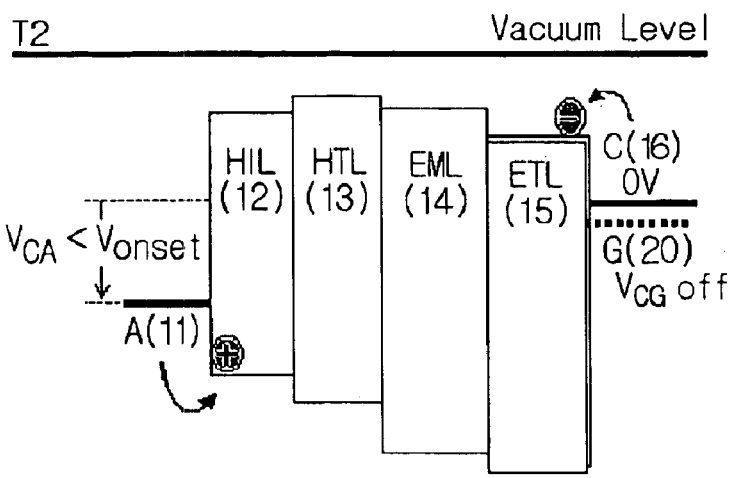
Figure 4C:
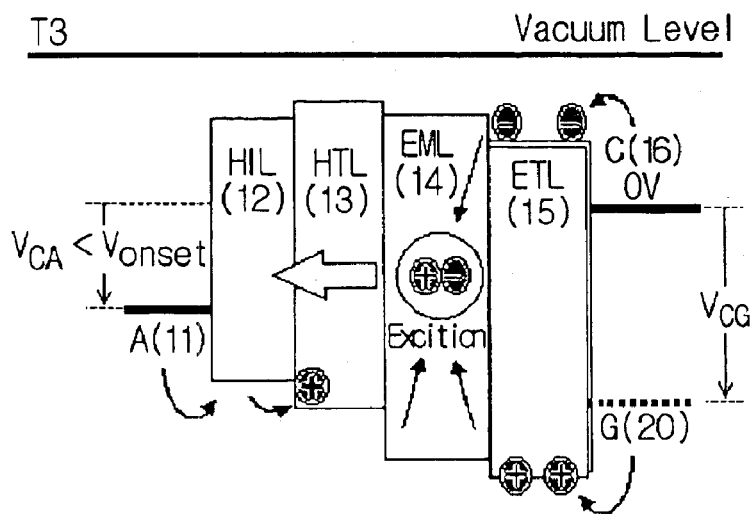

With reference to FIG. 4c showing potential diagrams of energy band structure for the case where the third electrode (G) 20 is formed on the electron-transporting layer 15 as shown in FIG. 4a, the principle for realizing the three-terminal organic EL device will be explained. In FIG. 4c, the electron is symbolized as a circled "−" (⊖), the hole is symbolized as a circled "+" (⊕), and migration of the electron or the holes is represented as an arrow. The numerals 11, 12, 13, 14, 15 16, and 20 mean the anode (A) 11, the hole injection layer (HIL) 12, the hole transporting layer (HTL) 13, the organic light-emitting layer (EML) 14, the electron transporting layer (ETL) 15, the cathode (C) 16, and the third electrode (G) 20, respectively. In the figure, $\phi_A$, $\phi_C$, and $\phi_G$ mean the work functions of the anode (A), the cathode (C), and the third electrode (G), respectively, while EA and IP represent electron affinity and ionization potential for the each organic layer, respectively.

When no voltage is applied to the anode (A) 11, the cathode (C) 16 and the third electrode (G) 20, the hole injection layer 12, the hole transporting layer 13, the organic light-emitting layer 14, and the electron transporting layer 15 are in thermodynamic equilibrium state so that Fermi levels thereof are identical to each other, as shown in T1 of FIG. 4c.

When the voltage $V_{CA}$ is applied between the anode (A) 11 and the cathode (C) 16, under the condition that the third electrode (G) 20 is disconnected from the external electric circuit, the holes are gradually injected from the anode (A) 11 into the highest occupied molecular orbital (HOMO) state of the hole injection layer 12 and also the electrons are gradually injected from the cathode (C) 16 into the lowest unoccupied molecular orbital (LUMO) state the electron transport layer 15. Here, if the applied voltage $V_{CA}$ is less than a turn-on voltage ($V_{ONSET}$), then the holes and the electrons cannot migrate into the organic light-emitting layer 14 and there is no occurrence of electro-luminescence, as shown in T2 of FIG. 4c, which is the same as the operation of the conventional two-terminal organic EL diode device. Thereafter, when the third electrode (G) 20 is connected to the external electric circuit and the positive voltage $V_{CG}$ is applied between the cathode (C) 16 and the third electrode (G) 20, the holes and the electrons can migrate into the organic light-emitting layer 14 through the HIL (12), HTL (13), and ETL (15) due to the electric field generated by $V_{CG}$. Moreover, the additive holes can be injected from the third electrode (G) 20 into the organic light-emitting layer 14 due to the local electric field effect between the cathode (C) 16 and the anode (A) 11. Thereby, electro-luminescence is generated from the radiative recombination of the holes and the electrons (exciton) in the organic light-emitting layer 14 as shown in T3 of FIG. 4c. That is, when the voltage $V_{CG}$ is applied to the third electrode (G) 20, the electroluminescence can be generated even by the voltage $V_{CA}$ less than $V_{ONSET}$. When the voltage $V_{CG}$ is fixed and the voltage $V_{CA}$ is gradually increased, concentrations of injected holes and electrons into the light-emitting layer 14 are gradually increased and luminance is also gradually increased, as shown in T4 of FIG. 4c. In this case, the current flows among the three electrodes can be written as $I_A=I_C+I_G$.

When the voltage $V_{CG}$ of 0V is applied between the cathode 16 and the third electrode 20, the energy band diagrams are shown in T5 and T6 of FIG. 4c. T5 show the energy band structure diagram for the case when the voltage $V_{CA}$ of 0V is applied between the cathode 16 and the anode 11, wherein no charge carriers are injected into the organic light-emitting layer 14. On the other hand, when the positive voltage $V_{CA}$ is applied between the cathode 16 and the anode 11, shown in the energy diagram of T6, the electrons from the cathode (C) 16 and the third electrode (G) 20 can be injected into the organic light-emitting layer 14 and the holes from the anode (A) 11 can be injected into the organic light-emitting layer 14. Thereby, the recombination of hoes and electrons (exciton) in organic light-emitting layer 14 can generate electro-luminescence, as shown in T6. Thus, at fixed $V_{CG}$ of 0V, the current flows of the three electrodes will increase from 0 as increasing $V_{CA}$ with a relation of $I_A=I_C+I_G$, where $I_A>0$, $I_C>0$, and $I_G>0$.

When the positive $V_{CG}$ is applied between the cathode (C) 16 and the third electrode (G) 20, the energy band structure diagrams are shown in T7 and T8 of FIG. 4c. T7 shows the energy diagram for the case when the voltage $V_{CA}$ of 0V is applied between the cathode 16 and the anode 11, wherein the electrons from the cathode (C) and the anode (A) can be injected into the organic light-emitting layer 14 and the holes from the third electrode (G) 20 can be injected into the organic light-emitting layer 14. In this case, the current flows of the three electrodes shows a relation of $I_A=I_C+I_G$, where $I_A<0$, $I_C>0$, and $I_G<0$. On the other hand, when the positive voltages of $V_{CA}$ and $V_{CG}$ are applied, the energy diagram is shown in T8. In this case, the electrons from the cathode (C) 16 can be injected into the organic light-emitting layer 14 and the holes from the anode (A) 11 and the third electrode (G) 20 can be injected into the organic light-emitting layer 14. Thereby, the recombination of hoes and electrons (exciton) at organic light-emitting layer 14 can generate electro-luminescence as shown in T8. In this case, the current flows of the three electrodes shows a relation of $I_A=I_C+I_G$, where $I_A>0$, $I_C>0$, and $I_G<0$. Thus, at fixed positive $V_{CG}$, the current flow $I_A$ of the anode will change its sign from negative to positive as increasing $V_{CA}$ from 0V.

Figure 4D:
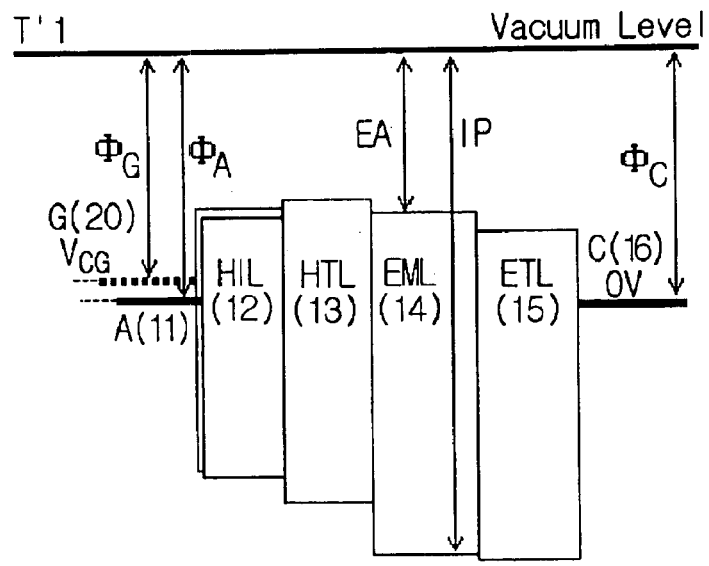
Figure 4D:
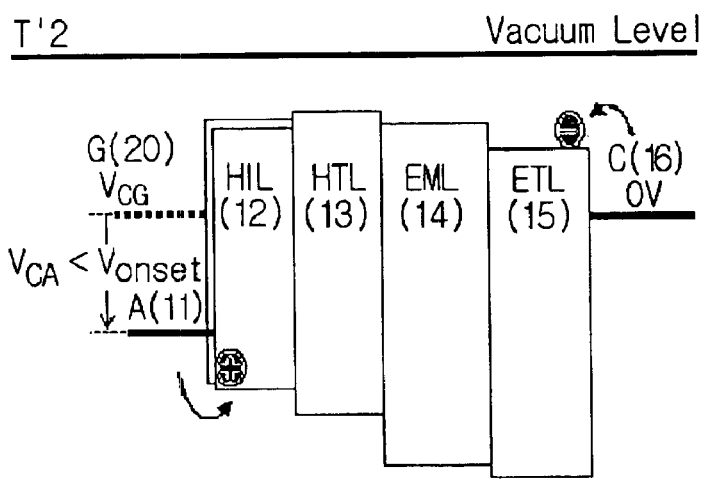
Figure 4D:
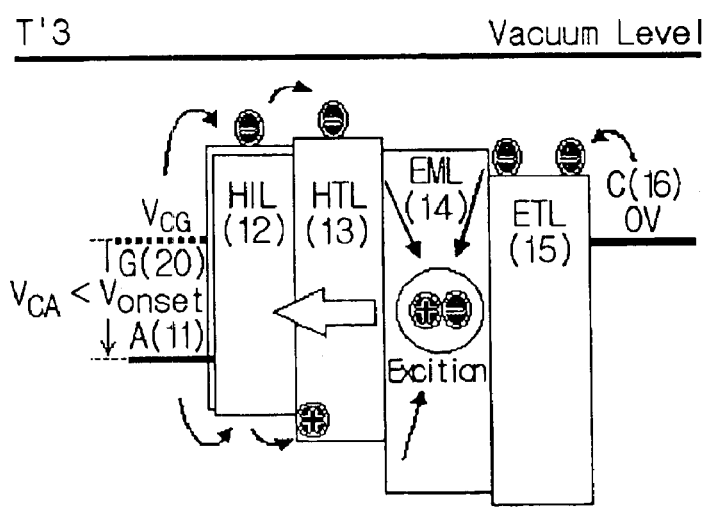

With reference to FIG. 4d showing another potential diagrams of energy band structure for the case where the third electrode (G) 20 is formed under the hole injection layer 12, the principle for realizing the three-terminal organic EL device will be also explained. In FIG. 4d, the electron is symbolized as a circled "−" (⊖), the hole is symbolized as a circled "+" (⊕), and migration of the electron or the hole is represented as an arrow. The numerals 11, 12, 13, 14, 15, 16, and 20 mean the anode (A) 11, the hole injection layer (HIL) 12, the hole transporting layer (HTL) 13, the organic light-emitting layer (EML) 14, the electron transporting layer (ETL) 15, the cathode (C) 16, and the third electrode (G) 20, respectively. In the figure, $\phi_A$, $\phi_C$, and $\phi_G$ represent the work functions of the anode (A), the cathode (C), and the third electrode (G), respectively, while EA and IP represent electron affinity and ionization potential for the each organic layer, respectively.

When no voltage is applied to the anode (A) 11, the cathode (C) 16 and the third electrode (G) 20, the hole injection layer 12, the hole transporting layer 13, the organic light-emitting layer 14 and the electron transporting layer 15 are in thermodynamic equilibrium state so that Fermi levels thereof are identical to each other, as shown in T'1 of FIG. 4d.

When the voltage $V_{CA}$ is applied between the anode (A) 11 and the cathode (C) 16, under the condition that the third electrode (G) 20 is disconnected from the external electric circuit, the holes are gradually injected from the anode (A) 11 into the highest occupied molecular orbital (HOMO) state of the hole injection layer 12 and also the electrons are gradually injected from the cathode (C) 16 into the lowest unoccupied molecular orbital (LUMO) state the electron transport layer 15. Here, if the applied voltage $V_{CA}$ is less than a turn-on voltage ($V_{ONSET}$), then the holes and the electrons cannot migrate into the organic light-emitting layer 14 and there is no occurrence of electro-luminescence, as shown in T'2 of FIG. 4d, which is the same as the operation of the conventional two-terminal organic EL device.

Thereafter, when the third electrode (G) 20 is connected to the external electric circuit and the voltage $V_{CG}$ of 0V is applied between the cathode (C) 16 and the third electrode (G) 20, the holes and the electrons can migrate into the organic light-emitting layer 14 through the HIL (12), HTL (13), and ETL (15) due to the electric field generated by $V_{AG}$ (or $V_{CG}$). Moreover, the additive holes can be injected from the third electrode (G) 20 into the organic light-emitting layer 14 due to the local electric field effect between the cathode (C) 16 and the anode (11). Thereby, electro-luminescence is generated from the radiative recombination of the holes and the electrons (exciton) in the organic light-emitting layer 14 as shown in T'3 of FIG. 4d. That is, when the voltage $V_{CG}$ of 0V is applied to the third electrode (G) 20, the electro-luminescence can be generated even by the voltage $V_{CA}$ less than $V_{ONSET}$. When the voltage $V_{CA}$ is gradually increased with $V_{CG}$=0V, concentrations of injecting holes and electrons into the light-emitting layer 14 are gradually increased and luminance is also gradually increased, as shown in T'4 of FIG. 4d. In this case, the current flows among the three electrodes can be written as $I_A=I_C+I_G$.

When the positive $V_{CG}$ is applied between the cathode (C) 16 and the third electrode (G) 20, the energy band diagrams are shown in T'5 and T'6 of FIG. 4d. T'5 show the energy diagram for the case when the voltage $V_{CA}$ of 0V is applied between the cathode (C) 16 and the anode (A) 11, wherein the electrons from the cathode (C) 16 and the anode (A) 11 can be injected into the organic light-emitting layer 14 and the holes from the third electrode (G) 11 can be injected into the organic light-emitting layer 14. Thus, even at $V_{CA}$=0V, the currents may flow among the three electrodes at fixed positive $V_{CG}$ with a relation of $I_A=I_C+I_G$, where $I_A<0$, $I_C>0$, and $I_G<0$. On the other hand, when the positive $V_{CA}$ is applied between the cathode (C) 16 and the anode (A) 11, the energy diagram is shown in T'6. In this case, the electrons from the cathode (C) 16 can be injected into the organic light-emitting layer 14 and the holes from the anode (A) 11 can be injected into the organic light-emitting layer 14. Thereby, the recombination of holes and electrons in the organic light-emitting layer 14 may generate electro-luminescence as shown in T'6. Thus, at positive $V_{CG}$, the current flow among the three electrodes has a relation of $I_A=I_C+I_G$, where $I_A>0$ and $I_C>0$. Thus, at fixed positive $V_{CG}$, the current flow $I_A$ of the anode will change its sign from negative to positive as increasing $V_{CG}$ from 0V.

Therefore, the luminance of the three-terminal organic EL device can be controlled by adjusting the potential of third electrode 20, affecting the flows of charge carriers into the organic layer, with respect to the potentials of the anode (A) 11 and the cathode (C) 16.

The following general methods and specific examples are presented merely to illustrate the invention and are not to be construed as limitations thereon.

EXAMPLES

Example 1

Figure 5:
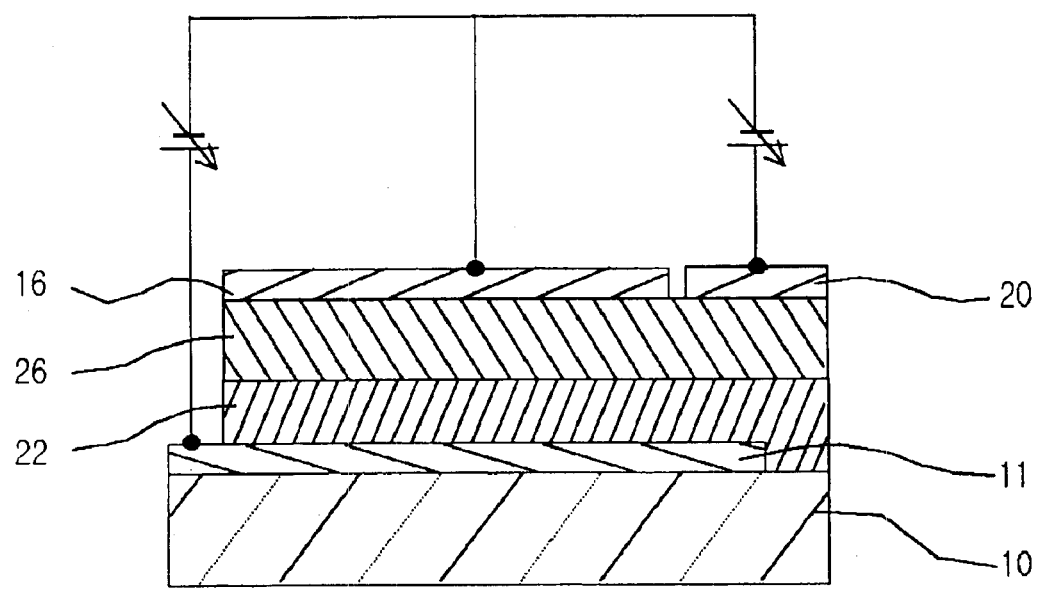

FIG. 5 is one example of the three-terminal organic EL device in FIG. 4a according to an embodiment of the present invention. As shown in FIG. 5, a three-terminal organic EL device was fabricated, which includes an anode (A) 11 made of ITO, formed on a transparent substrate 10, and organic material layers 22, 26 including a hole injection layer 12 made of m-MTDATA, a hole transporting layer 13 made of α-NPD, a green light-emitting layer 14 made of $Alq_3$, and a electron transporting layer 15 made of $Alq_3$. The organic thin layers were thermally deposited at rate of 0.2 nm/s at $5×10^{-5}$ Torr onto an ITO-coated glass substrate with a sheet resistance of 10–20 ohm/square. The thickness of the hole injection layer, hole transporting layer, the organic emitting layer and the electron injection layer are about 40 nm, 20 nm, 60 nm and 20 nm, respectively. Then, a cathode 16 made of Al—Li compound (1000 nm), is formed on the top of the organic material layers at $5×10^{-5}$ Torr. Beside of the cathode 16, a third electrode 20, made of Al—Li compound, is formed on the organic material layer 26 outside of region between the anode 11 and the cathode 16. The distance between the second and the third electrodes is 30 micrometer. The anode 11, the cathode 16, and the third electrode 20 were connected to the external circuit as shown in FIG. 5, so as to have positive or negative potentials with respect to each other.

Figure 6:
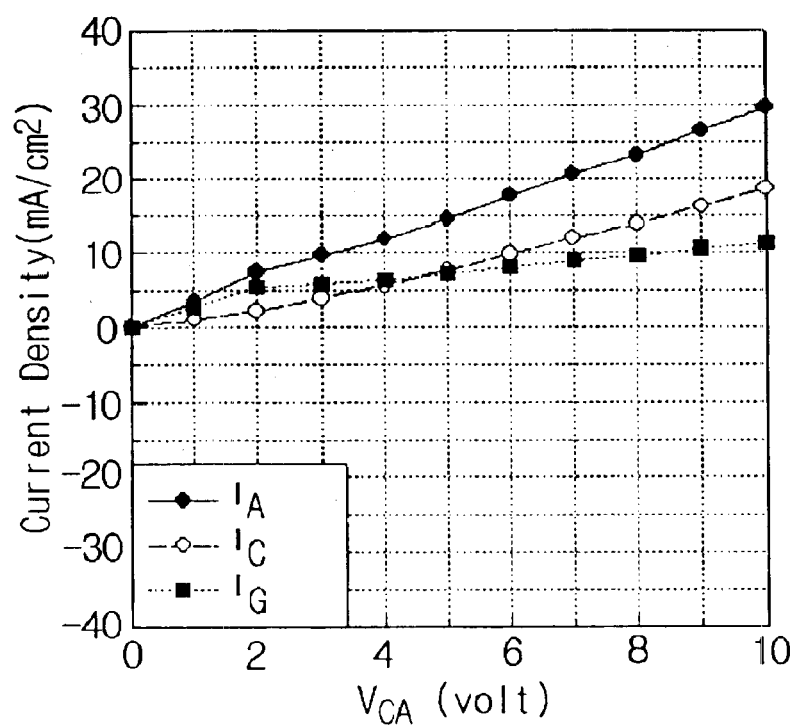
FIG. 6 is a graph showing current-voltage curves of anode (A) current vs. voltage ($I_A$ vs. $V_{CA}$), cathode (C) current vs. voltage ($I_C$ vs. $V_{CA}$), and third electrode (G) vs. voltage ($I_G$ vs. $V_{CA}$) at $V_{CG}$=0V for the three-terminal organic EL device in FIG. 5.

FIG. 6 illustrates a graph showing current vs. voltage (J-V) curves of anode (A) current vs. voltage ($I_A$ vs. $V_{CA}$), cathode (C) current vs. voltage ($I_C$ vs. $V_{CA}$), and third electrode (G) vs. voltage ($I_G$ vs. $V_{CA}$) at $V_{CG}$=0V for the three-terminal organic EL device in FIG. 5. As shown in FIG. 6, when the voltage $V_{CA}$ is 0V, all currents of $I_A$, $I_C$, and $I_G$ are 0 mA. On the other hand, as the voltage $V_{CA}$ is increased, the currents of $I_A$, $I_C$, and $I_G$ are also gradually increased. The numeral values of the currents of $I_A$, $I_C$, and $I_G$ are shown in table 1.

TABLE 1

| | $mA/cm^2$ | | | |
|---|---|---|---|---|
| $V_{CA}(V)$ | $I_A$ | $I_C$ | $I_G$ | $I_C + I_G$ |
| 0.0 | 0.0 | 0.0 | 0.0 | 0.0 |
| 1.0 | 3.5 | 1.0 | 2.7 | 3.7 |
| 2.0 | 7.4 | 2.2 | 5.4 | 7.6 |
| 3.0 | 9.6 | 3.9 | 5.8 | 9.7 |
| 4.0 | 11.8 | 6.0 | 6.3 | 12.3 |
| 5.0 | 14.6 | 7.6 | 7.2 | 14.8 |
| 6.0 | 17.7 | 9.8 | 8.0 | 17.8 |
| 7.0 | 20.6 | 12.0 | 8.9 | 20.9 |
| 8.0 | 23.2 | 13.9 | 9.5 | 23.4 |
| 9.0 | 26.5 | 16.2 | 10.6 | 26.8 |
| 10.0 | 29.7 | 18.6 | 11.3 | 29.9 |

From the table 1, one can confirm that the relation of currents $I_A$, $I_C$, and $I_G$ is $I_A=I_C+I_G$ with ($I_A>0$, $I_C>0$, and $I_G>0$), which is illustrated in energy diagrams in T5 and T6 of FIG. 4c. Accordingly, it is demonstrated that the organic EL device in FIG. 5 functions as a three-terminal device.

Figure 7:
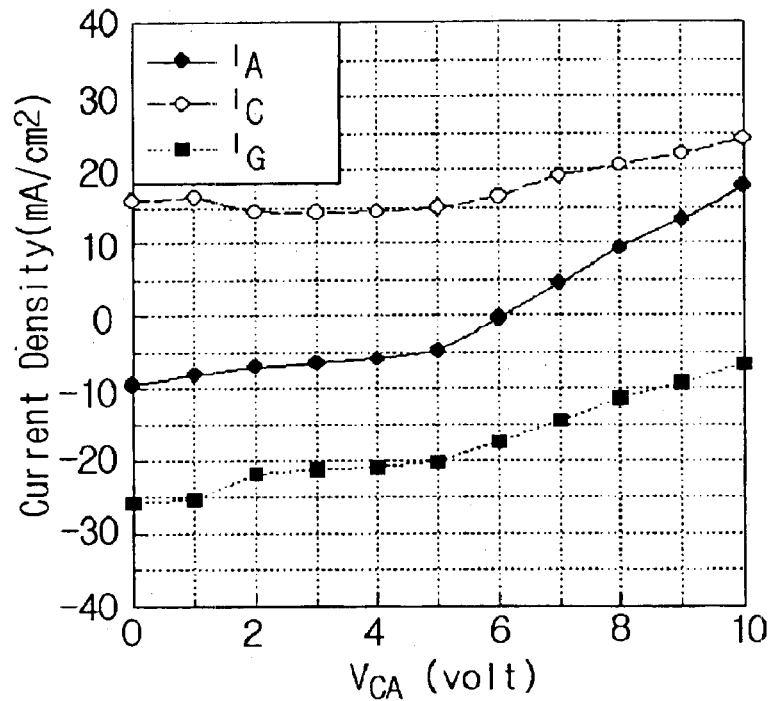
FIG. 7 is a graph showing current-voltage curves of ($I_A$ vs. $V_{CA}$), ($I_C$ vs. $V_{CA}$), and ($I_G$ vs. $V_{CA}$) at $V_{CG}$=9V for the three-terminal organic EL device in FIG. 5.

FIG. 7 illustrates a graph showing current vs. voltage (J-V) curves of ($I_A$ vs. $V_{CA}$), ($I_C$ vs. $V_{CA}$), and ($I_G$ vs. $V_{CA}$) at $V_{CG}$=9V for the three-terminal organic EL device in FIG. 5. The behaviors of $I_A$, $I_C$, and $I_G$ vs. $V_{CA}$ at $V_{CG}$=9V are very different from those at $V_{CG}$=0V shown in FIG. 6. As shown in FIG. 7, even $V_{CA}$=0V, the currents of $I_A$, $I_C$, and $I_G$ is not 0 $mA/cm^2$. As the voltage $V_{CA}$ increases, the current $I_G$ of the third electrode gradually increases from a negative value, while the current $I_C$ of the cathode is a nearly positive constant until $V_{CA}$=6V following gradual increase after $V_{CA}$=6V. The current $I_A$ of the anode gradually increases from a negative value at $V_{CA}$=0V, as the voltage $V_{CA}$ increases. Near $V_{CA}$=6V, the current $I_A$ changes its sign to positive. The numeral values of currents $I_A$, $I_C$, and $I_G$ shown in FIG. 7 are summarized in table 2.

TABLE 2

| | $mA/cm^2$ | | | |
|---|---|---|---|---|
| $V_{CA}(V)$ | $I_A$ | $I_C$ | $I_G$ | $I_C + I_G$ |
| 0.0 | −9.6 | 16.0 | −25.8 | −9.8 |
| 1.0 | −8.2 | 16.5 | −25.4 | −8.9 |
| 2.0 | −7.1 | 14.5 | −21.8 | −7.3 |
| 3.0 | −6.5 | 14.4 | −21.2 | −6.8 |
| 4.0 | −5.9 | 14.5 | −20.9 | −6.4 |
| 5.0 | −4.8 | 15.0 | −20.2 | −5.2 |
| 6.0 | −0.5 | 16.5 | −17.4 | −0.9 |
| 7.0 | 4.6 | 19.1 | −14.4 | 4.7 |
| 8.0 | 9.3 | 20.6 | −11.3 | 9.3 |
| 9.0 | 13.3 | 22.2 | −9.4 | 12.8 |
| 10.0 | 17.7 | 24.3 | −6.7 | 17.6 |

As shown in the table 2, one can again confirm that the relation of currents $I_A$, $I_C$ and $I_G$ is $I_A=I_C+I_G$ with $I_C>0$, $I_G<0$, and $I_A$ changing its sign from negative to positive as increasing $V_{CA}$ from 0V, which is also illustrated in energy diagrams of T7 and T8 in FIG. 4c. Thus, with referring to FIGS. 6 and 7 together with Tables 1 and 2, it is demonstrated that the organic EL device of FIG. 5 functions as a three-terminal organic EL device, in which the current flows among the anode, the cathode, and third electrode can be controlled by the adjustment of voltage applied to the third electrode even though the voltage $V_{CA}$ is fixed.

Figure 8:
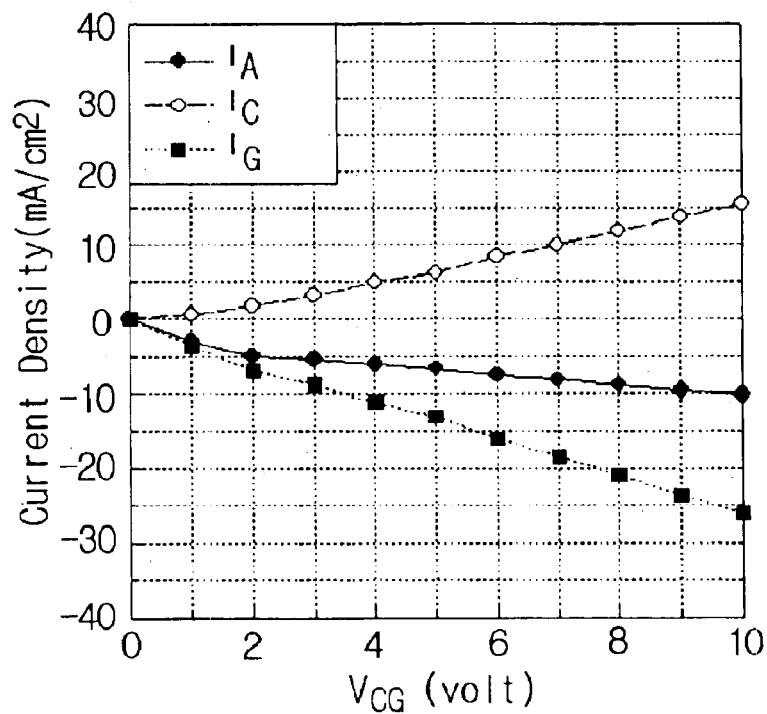
FIG. 8 is a graph showing current-voltage curves of ($I_A$ vs. $V_{CG}$), ($I_C$ vs. $V_{CG}$), and ($I_G$ vs. $V_{CG}$) at $V_{CA}$=0V for the three-terminal organic EL device in FIG. 5.

FIG. 8 is a graph showing current vs. voltage (J-V) curves of ($I_A$ vs. $V_{CG}$), ($I_C$ vs. $V_{CG}$), and ($I_G$ vs. $V_{CG}$) at $V_{CA}$=0V for the three-terminal organic EL device in FIG. 5. In FIG. 8, when the voltage $V_{CG}$ is 0V, the currents $I_A$, $I_C$, and $I_G$ are 0 $mA/cm^2$. However, as the voltage V CG is increased, the currents $I_C$ is gradually increased, while the currents $I_A$ and $I_G$ are gradually decreased. The numeral values of currents $I_A$, $I_C$, and $I_G$ are summarized in table 3.

TABLE 3

| | $mA/cm^2$ | | | |
|---|---|---|---|---|
| $V_{CG}(V)$ | $I_A$ | $I_C$ | $I_G$ | $I_C + I_G$ |
| 0.0 | 0.0 | 0.0 | 0.0 | 0.0 |
| 1.0 | −3.0 | 0.6 | −3.7 | −3.1 |
| 2.0 | −5.0 | 1.8 | −6.9 | −5.1 |
| 3.0 | −5.4 | 3.2 | −8.8 | −5.6 |
| 4.0 | −6.1 | 5.0 | −11.2 | −6.2 |
| 5.0 | −6.4 | 6.2 | −13.1 | −6.9 |
| 6.0 | −7.5 | 8.3 | −16.1 | −7.8 |
| 7.0 | −8.2 | 9.9 | −18.4 | −8.5 |
| 8.0 | −8.9 | 11.8 | −20.9 | −9.1 |

TABLE 3-continued

| | mA/cm² | | | |
|---|---|---|---|---|
| $V_{CG}(V)$ | $I_A$ | $I_C$ | $I_G$ | $I_C + I_G$ |
| 9.0 | −9.5 | 13.8 | −23.8 | −10.0 |
| 10.0 | −10.2 | 15.6 | −26.2 | −10.6 |

From the table 3, one can also confirm that the relation of currents $I_A$, $I_C$, and $I_G$ is $I_A=I_C+I_G$ with ($I_C>0$, $I_G<0$, and $I_A<0$), which is also illustrated in energy diagrams of T5 and T7 in FIG. 4c for the organic EL device in FIG. 5. Therefore, it is also demonstrated that the organic EL device of FIG. 5 functions as a three-electrode organic device.

Figure 9:
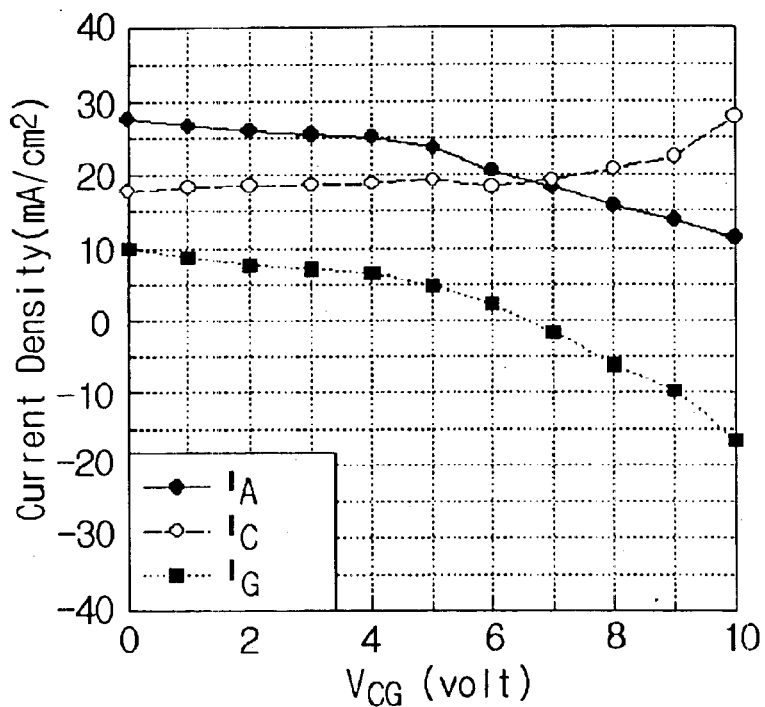
FIG. 9 is a graph showing current-voltage curves of ($I_A$ vs. $V_{CG}$), ($I_C$ vs. $V_{CG}$), and ($I_G$ vs. $V_{CG}$) at $V_{CA}$=9V for the three-terminal organic EL device in FIG. 5.

FIG. 9 is a graph showing current vs. voltage (J-V) curves of ($I_A$ vs. $V_{CG}$), ($I_C$ vs. $V_{CG}$), and ($I_G$ vs. $V_{CG}$) at $V_{CA}=9V$ for the three-terminal organic EL device in FIG. 5. The behaviors of $I_A$, $I_C$, and $I_G$ vs. $V_{CG}$ at $V_{CA}=9V$ are very different from those at $V_{CA}=0V$ shown in FIG. 8. Shown in FIG. 9, even the voltage $V_{CG}$ is 0V, the currents of $I_A$, $I_C$, and $I_G$ are all positive values not 0 mA/cm². As the voltage $V_{CG}$ increases, the current $I_A$ of the anode gradually decreases from a positive value, while the current $I_C$ of the cathode is a nearly positive constant until $V_{CG}=6.5V$, following gradual increase after $V_{CG}=6.5V$. The current $I_G$ of the third electrode gradually decreases from a positive value at $V_{CG}=0V$, as the voltage $V_{CA}$ increases. Near $V_{CA}=6.5V$, the current $I_G$ changes its sign to negative. The numeral values of the currents $I_A$, $I_C$, and $I_G$ in FIG. 9 are summarized in table 4.

TABLE 4

| | mA/cm² | | | |
|---|---|---|---|---|
| $V_{CG}(V)$ | $I_A$ | $I_C$ | $I_G$ | $I_C + I_G$ |
| 0.0 | 27.7 | 17.8 | 10.1 | 27.9 |
| 1.0 | 26.6 | 18.2 | 8.8 | 27.0 |
| 2.0 | 25.9 | 18.5 | 7.7 | 26.2 |
| 3.0 | 25.4 | 18.6 | 7.0 | 25.6 |
| 4.0 | 25.1 | 18.8 | 6.5 | 25.3 |
| 5.0 | 23.6 | 19.3 | 4.8 | 24.1 |
| 6.0 | 20.6 | 18.3 | 2.3 | 20.6 |
| 7.0 | 18.2 | 19.3 | −1.7 | 17.6 |
| 8.0 | 15.7 | 20.8 | −6.2 | 14.6 |
| 9.0 | 13.8 | 22.4 | −9.8 | 12.6 |
| 10.0 | 11.4 | 27.8 | −16.6 | 11.2 |

From the table 4, one can again confirm that the relation of currents $I_A$, $I_C$, and $I_G$ is $I_A=I_C+I_G$ with $I_C>0$, $I_A>0$, and $I_G$ changing its sign from positive to negative as increasing $V_{CG}$, which is also illustrated in energy diagrams of T6 and T8 in FIG. 4c. Thus, with referring to FIGS. 8 and 9 together with Tables 3 and 4, it is demonstrated that the organic EL device in FIG. 5 functions as a three-terminal organic EL device in which the current flows among the anode, the cathode, and the third electrode can be controlled by the adjustment of voltage applied to the third electrode even though the voltage $V_{CA}$ is fixed.

Figure 10A:
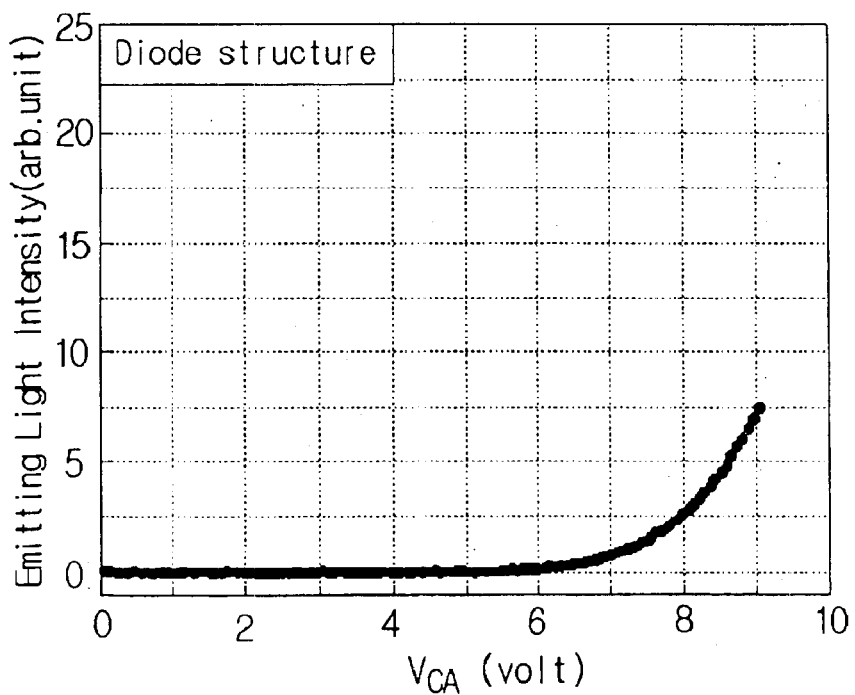
FIG. 10a is a graph showing emitting light intensity vs. voltage ($V_{CA}$) curves of the organic EL device in FIG. 5, wherein the third electrode (G) is disconnected from the external electric circuit and thus the device is operated as a conventional two-terminal organic EL diode.

Green-emission from $Alq_3$ layer was observed from the three-terminal organic EL device in FIG. 5 with a continuous DC for forward-biased ITO electrode at positive polarity. FIG. 10a is a graph showing emitting light intensity vs. voltage ($V_{CA}$) (L-V) curve of the three-terminal organic EL device in FIG. 5 with disconnecting the third electrode from the external electric circuit, operating as a conventional two-terminal organic EL device. As shown in FIG. 10a, the electro-luminescence starts at a $V_{CA}$ of about 6V ($V_{ONSET}=$ 6V) and the emitting light intensity is gradually increased as the voltage $V_{CA}$ is increased, showing a typical light intensity vs. voltage (L-V) behavior of a conventional two-terminal EL device. Specifically, at $V_{CA}=9V$, the brightness of luminance and current density reach about 330 cd/m² and 10.6 mA/cm², respectively, giving luminance efficiency of ~3.1 cd/A.

Figure 10B:
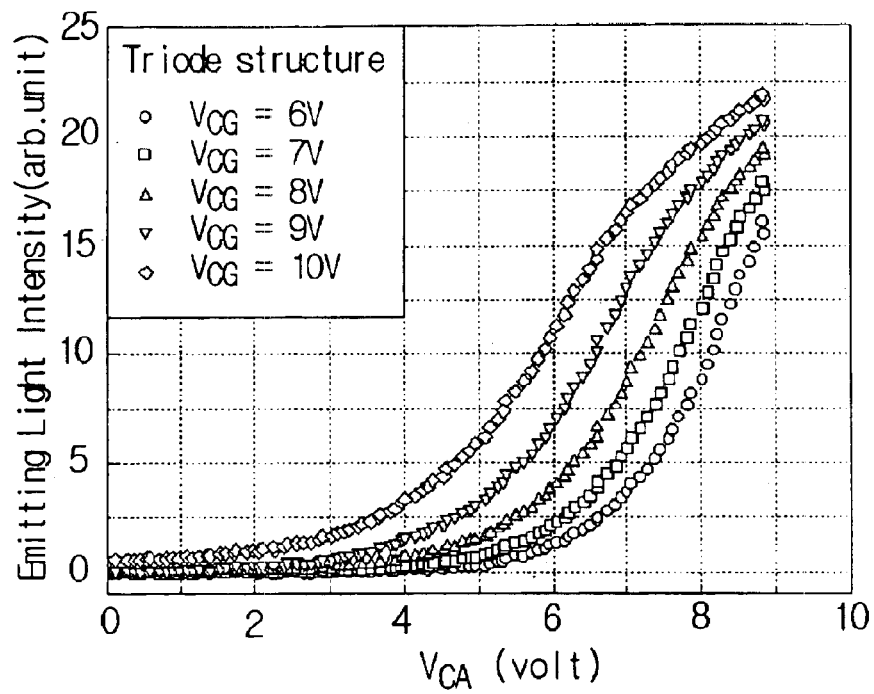
FIG. 10b is a graph showing emitting light intensity vs. voltage ($V_{CA}$) curves of the three-terminal organic EL device in FIG. 5 for several different cathode-third electrode bias voltages ($V_{CG}$=6V, 7V, 8V, 9V, and 10V)

FIG. 10b is a graph showing emitting light intensity vs. voltage ($V_{CA}$) (L-V) curves of the three-terminal organic EL device in FIG. 5 for several different cathode-third electrode bias voltages ($V_{CG}=6V$, 7V, 8V, 9V, and 10V). As shown in FIG. 10b, the turn-on voltage of $V_{CA}$ can be reduced below 5V, which is well below the 5V typical for IC driving circuitry, and the luminance can be remarkably increased even at low $V_{CA}$. For example, in case when $V_{CG}=9V$, the electro-luminescence is started at $V_{CA}$ of about 2V and increased as the voltage $V_{CA}$ is increased. Specifically, at $V_{CA}=9V$ and $V_{CG}=9V$, the brightness of luminance and current density reach about 880 cd/m² and $I_A=17.7$ mA/cm², respectively, giving enhanced luminance efficiency of ~5.0 cd/A. It cannot be achieved from the conventional two-terminal organic EL device shown in FIG. 10a and it is the feature of the three-terminal organic EL device of the present invention.

Figure 10C:
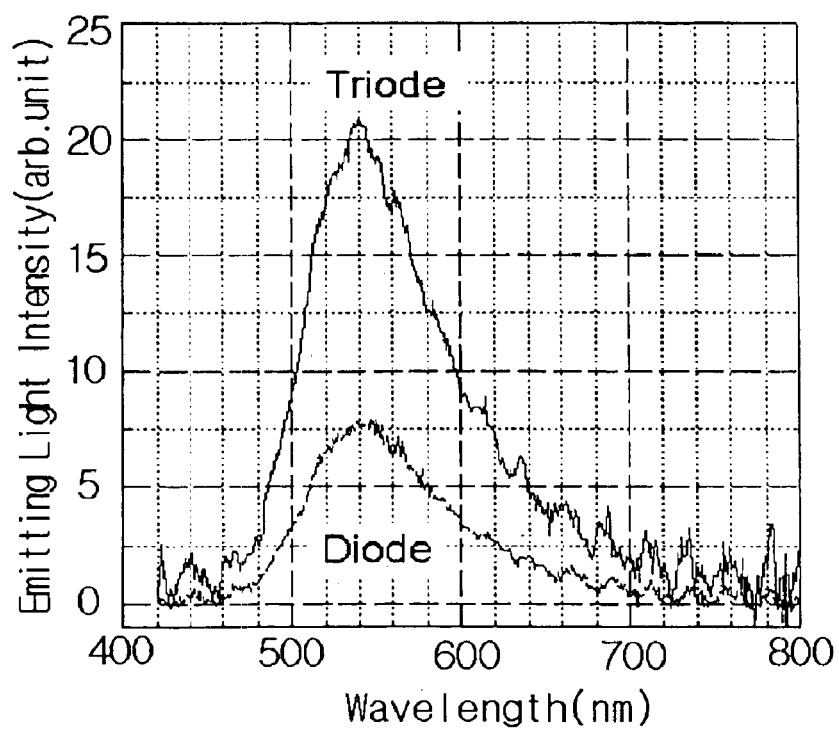
FIG. 10c illustrates a graph showing EL emission spectra ("Triode") of the EL device in FIG. 5 at $V_{CA}$=9V with $V_{CG}$=9V and those ("Diode") of the EL device in FIG. 5 at $V_{CA}$=9V without applying $V_{CG}$ (the third electrode (G) is disconnected from the external electric circuit)

FIG. 10c illustrates a graph showing EL emission spectra ("Triode") of the EL device in FIG. 5 at $V_{CA}=9V$ with $V_{CG}=9V$ and those ("Diode") of the EL device in FIG. 5 at $V_{CA}=9V$ with disconnected the third electrode from the external circuit. The devices show the emission from $Alq_3$ layer, which emit light at 540 nm. That means that carrier recombination occurs at $Alq_3$ layer. Also, the spectral shape of the three-terminal device is nearly the same as that of the conventional two-terminal device, except for the increased luminance of the three-terminal device.

As described above, it is demonstrated that the three-terminal organic EL device in FIG. 5 is a light-emitting structure with increased efficiency, decreased turn-on voltage ($V_{ONSET}$), and increased brightness.

Figure 11:
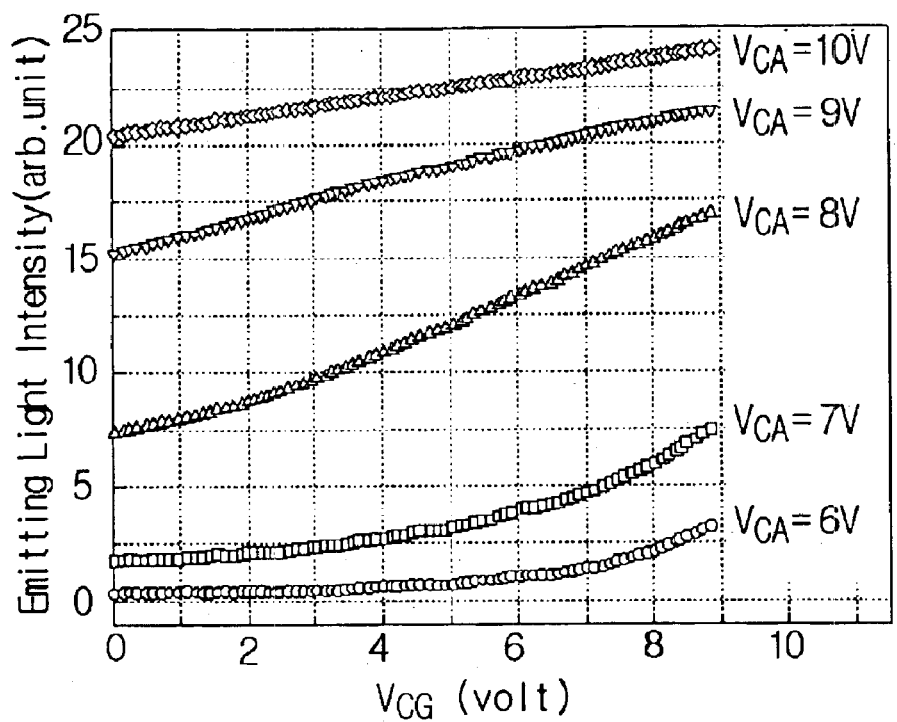
FIG. 11 is a graph showing emitting light intensity vs. voltage ($V_{CG}$) curves of the three-terminal organic EL device in FIG. 5 for several different cathode-anode bias voltages ($V_{CA}$=6V, 7V, 8V, 9V, and 10V)

FIG. 11 is a graph showing light intensity vs. voltage ($V_{CG}$) (L-V) curves of the three-terminal organic EL device in FIG. 5 for several different cathode-anode bias voltages ($V_{CA}=6V$, 7V, 8V, 9V, and 10V). For a given voltage $V_{CA}$, the emitting light intensity of the organic EL device is apparently increased as the voltage $V_{CG}$ is increased. For example, in case when the voltage $V_{CA}$ is 8V, the luminance of about 770 cd/m² at $V_{CG}=9V$ is about 2.3 times brighter than that of about 330 cd/m² at $V_{CG}=0V$. As a result, one can again confirm that the organic EL device in FIG. 5 functions as a three-terminal device in which the luminance can be controlled by the adjustment of voltage applied to the third electrode even though the voltage $V_{CA}$ is fixed.

Figure 12A:
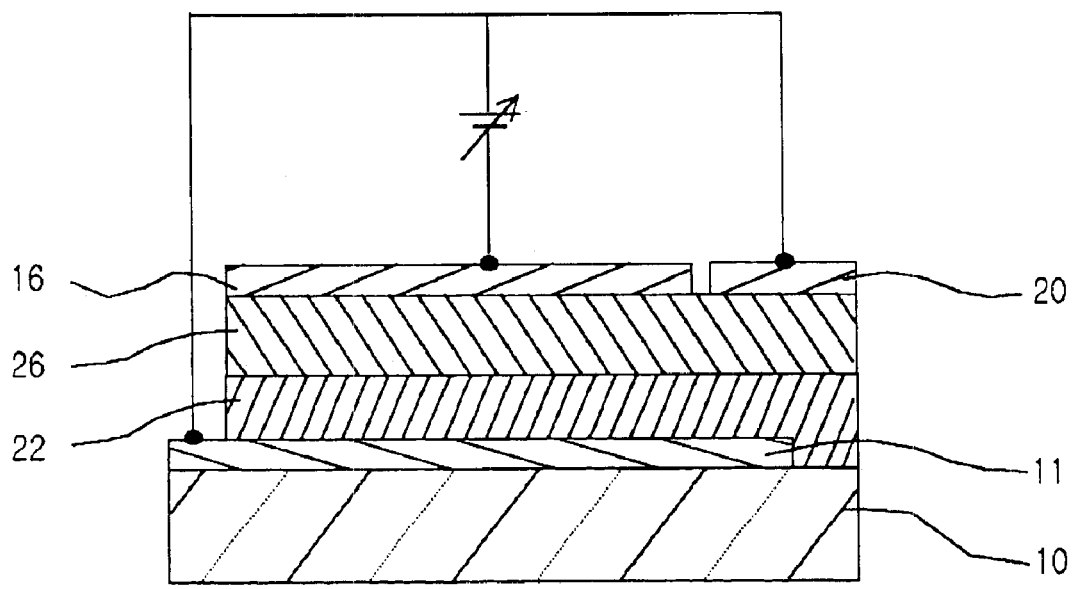
FIG. 12a illustrates a schematic, not-to-scale cross sectional view of a three-terminal organic EL device in FIG. 5, operating at $V_{CA}$=$V_{CG}$.
Figure 12B:
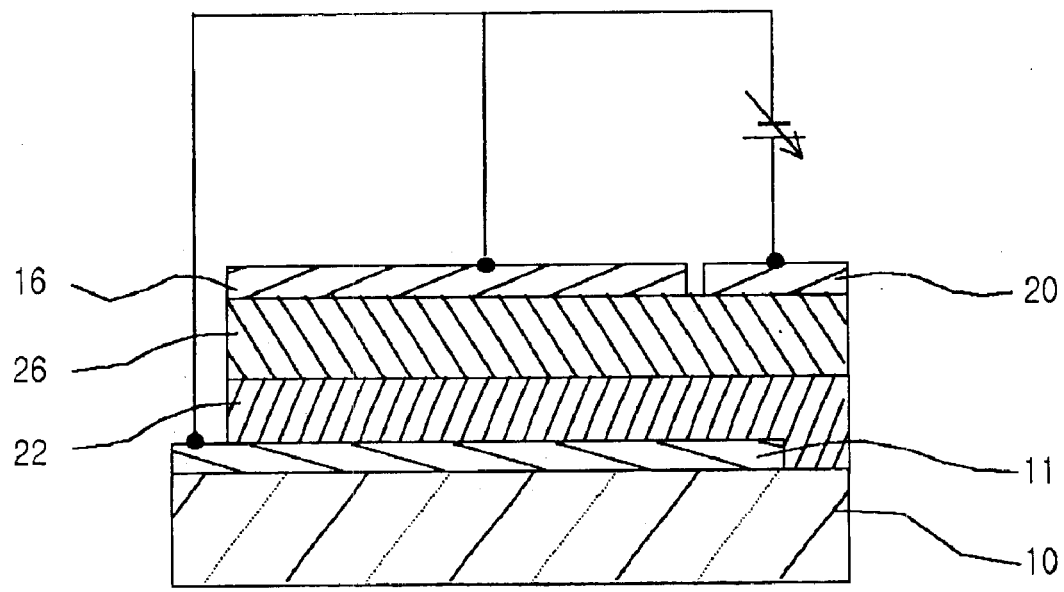
FIG. 12b illustrates a cross sectional view of a three-terminal organic EL device in FIG. 5, operating at $V_{CG}$=$V_{AG}$.
Figure 12C:
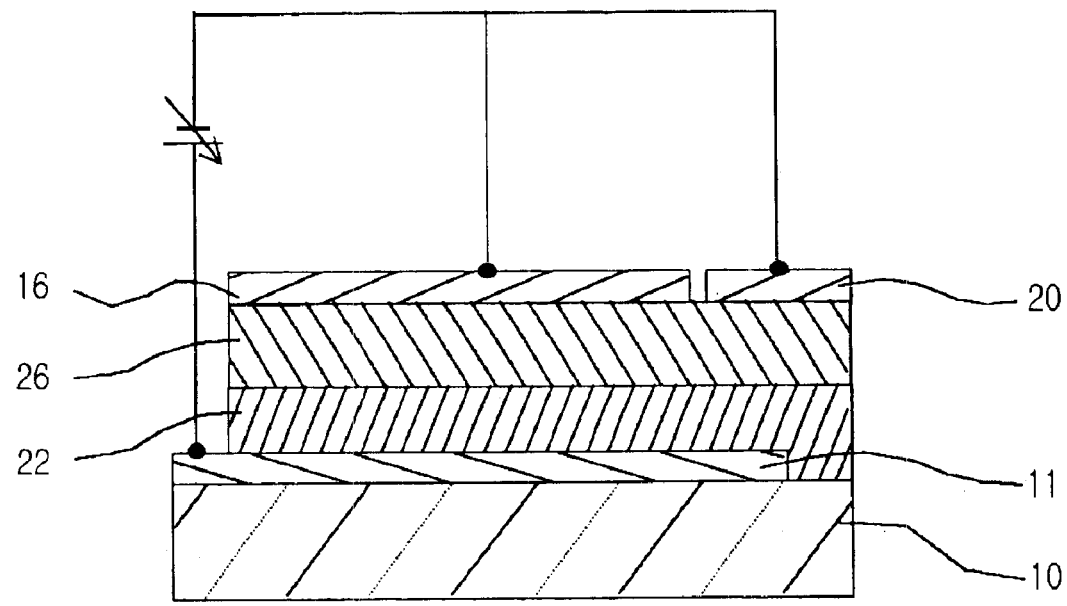
FIG. 12c illustrates a cross sectional view of a three-terminal organic EL device in FIG. 5, operating at $V_{GA}$=$V_{CA}$.
Figure 13:
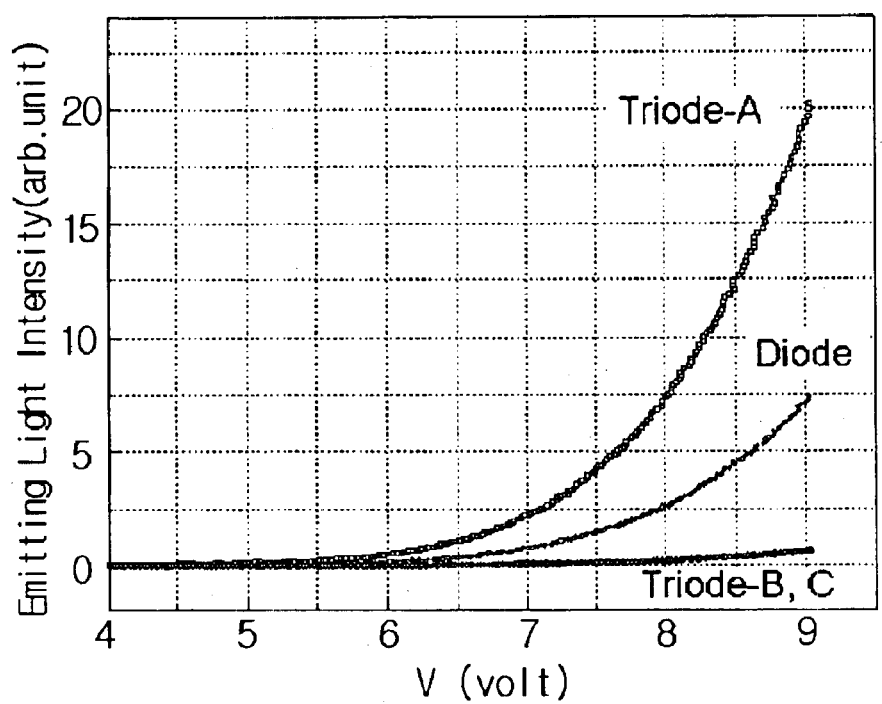
FIG. 13 is a graph showing emitting light intensity vs. applied voltage curves for the devices in FIGS. 12a ("Triode-A"), 12b and 12c ("Triode-B, C"), wherein the emitting light intensity vs. voltage curve ("Diode") is also shown for the EL device in FIG. 5 with disconnecting the third electrode from the external electric circuit, operating as a two-terminal organic EL device.

FIGS. 12a, 12b, and 12c illustrate examples of the three-terminal organic EL device in FIG. 5, operating at $V_{CA}=V_{CG}$, $V_{CG}=V_{AG}$, and $V_{CA}=V_{GA}$, respectively. FIG. 13 illustrates a graph showing emitting light intensity vs. applied voltage (L-V) characteristics for the three-terminal devices in FIGS. 12a ("Triode-A"), 12b and 12c ("Triode-B, C"). For the comparison, L-V characteristics ("Diode") for the EL device in FIG. 5 with disconnected the third electrode from external circuit is also shown in the figure.

As shown in the figure, the emitting light intensity for "Triode-A" is remarkably increased as compared with that for "Diode". Specially, at the applied voltage of 9 V, the luminance of about 880 cd/m² for "Triode-A" is about 2.3 times brighter than that of about 330 cd/m² for "Diode".

Thus, one can easily obtain the increased luminance from the "Triode-A" structure. On the contrary, the luminance of "Triode-B, C" is remarkably reduced as compared with that of "Diode". Therefore, one can again confirm that the organic EL device in FIG. 5 is the three-terminal device functions as a three-terminal device having increased efficiency and increased brightness according to the present invention.

Example 2

Figure 14:
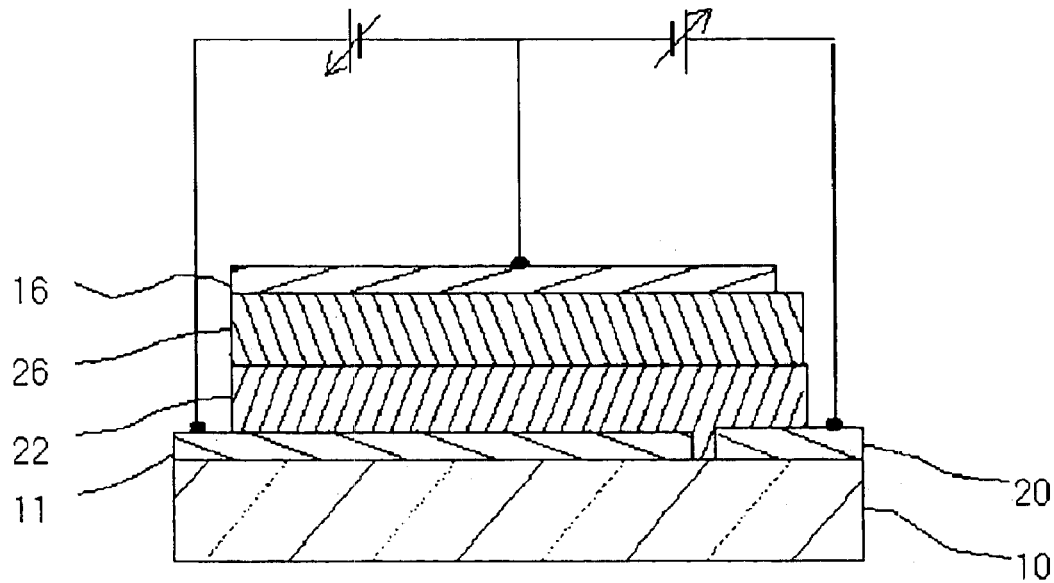
FIG. 14 illustrates one example of the three-terminal organic EL device in FIG. 4b.

FIG. 14 illustrates one example of the three-terminal organic EL device in FIG. 4b according to an embodiment of the present invention. Following FIG. 14, a three-terminal organic EL device was fabricated, which includes an anode (A) 11 made of ITO formed on a transparent substrate 10, and organic material layers 22, 26 including a hole injection layer 12 made of m-MTDATA, a hole transporting layer 13 made of α-NPD, a green light-emitting layer 14 made of $Alq_3$, and a electron transporting layer 15 made of $Alq_3$. The organic thin layers were thermally deposited at rate of 0.2 nm/s at $5 \times 10^{-5}$ Torr onto an ITO-coated glass substrate with a sheet resistance of 10–20 ohm/square. The thickness of the hole injection layer, the hole transporting layer, the organic emitting layer and the electron injection layer are about 40 nm, 20 nm, 60 nm and 20 nm, respectively. Then a cathode 16 made of Al—Li compound (1000 nm), is formed on the top of the organic material layers at $5 \times 10^{-5}$ Torr.

Beside of the anode (first electrode) 11 and the cathode (second electrode) 16, a third electrode 20, made of ITO, is formed under the organic material layer 22 outside of region, which is defined between the anode 11 and the cathode 16. The distance between the first electrode 11 and third electrodes is about 50 micrometer. The anode 11, the cathode 16, and the third electrode 20 were connected to the external circuit as shown in FIG. 14, so as to have positive or negative potentials with respect to each other.

Figure 15:
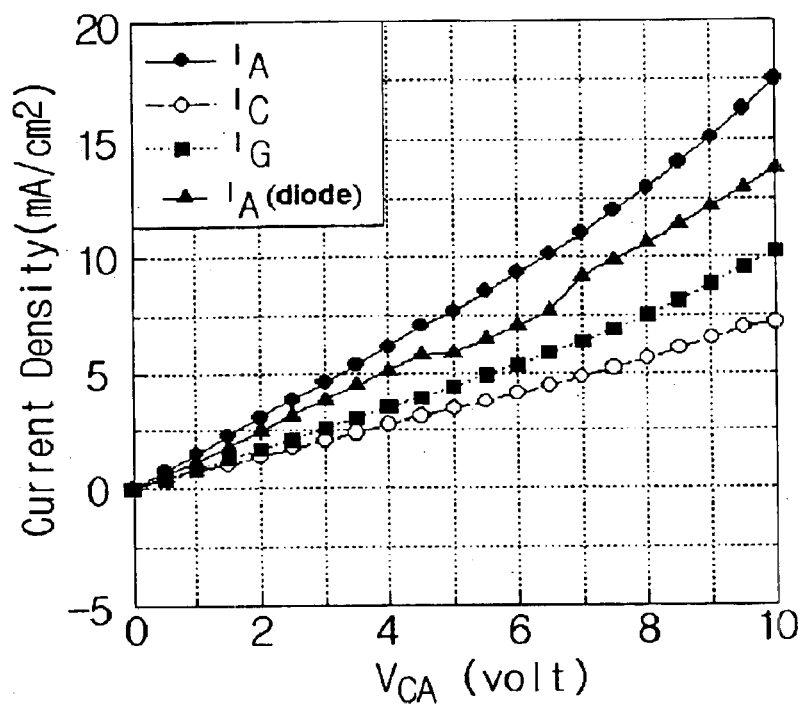
FIG. 15 is a graph showing current-voltage curves for ($I_A$ vs. $V_{CA}$), ($I_C$ vs. $V_{CA}$), and ($I_G$ vs. $V_{CA}$) at $V_{CG}$=0V for the three-terminal organic EL device in FIG. 14. Here, the filled triangle curve shows ($I_A$ vs. $V_{CA}$) for the EL device in FIG. 14 with disconnecting the third electrode from the external electric circuit, operating as a two-terminal organic EL device.

FIG. 15 illustrates a graph showing current vs. voltage (J-V) curves of ($I_A$ vs. $V_{CA}$), ($I_C$ vs. $V_{CA}$), and ($I_G$ vs. $V_{CA}$) at $V_{CG}=0V$ for the three-terminal organic EL device in FIG. 14. As shown in FIG. 15, when the voltage $V_{CA}$ is 0V, all currents of $I_A$, $I_C$, and $I_G$ are 0 mA/cm². However, as the voltage $V_{CA}$ is increased, the currents of $I_A$, $I_C$, and $I_G$ are also gradually increased. For comparison, ($I_A$ vs. $V_{CA}$) curve of diode characteristics for the three-terminal organic EL device with disconnecting the third electrode from the external circuit is also shown as filled triangles in the FIG. 15. As shown in the figure, current flow of the anode 11 in the three-terminal structure is more increased than that in the diode structure. That is, injection of charge carriers into the light-emitting layer 14 in the three-terminal structure is more increased than that in the diode structure. The numeral values of the currents of $I_A$, $I_C$, and $I_G$ are shown in table 5.

From the table 5, one can confirm that the relation of currents $I_A$, $I_C$, and $I_G$ is $I_A = I_C + I_G$ with ($I_A > 0$, $I_C > 0$, and $I_G > 0$), which is illustrated in energy diagrams in T'3 and T'4 of FIG. 4d. Accordingly, it is demonstrated that the organic EL device in FIG. 14 functions as a three-terminal device.

TABLE 5

| | mA/cm² | | | |
|---|---|---|---|---|
| $V_{CA}(V)$ | $I_A$ | $I_C$ | $I_G$ | $I_C + I_G$ |
| 0.0 | 0.0 | 0.0 | 0.0 | 0.0 |
| 1.0 | 1.5 | 0.8 | 0.9 | 1.7 |

TABLE 5-continued

| | mA/cm² | | | |
|---|---|---|---|---|
| $V_{CA}(V)$ | $I_A$ | $I_C$ | $I_G$ | $I_C + I_G$ |
| 2.0 | 3.1 | 1.4 | 1.7 | 3.1 |
| 3.0 | 4.6 | 2.1 | 2.6 | 4.7 |
| 4.0 | 6.1 | 2.7 | 3.5 | 6.2 |
| 5.0 | 7.7 | 3.4 | 4.4 | 7.8 |
| 6.0 | 9.3 | 4.1 | 5.3 | 9.4 |
| 7.0 | 11.0 | 4.8 | 6.3 | 11.1 |
| 8.0 | 12.9 | 5.6 | 7.5 | 13.1 |
| 9.0 | 15.1 | 6.5 | 8.8 | 15.3 |
| 10.0 | 17.5 | 7.2 | 10.2 | 17.4 |

Figure 16:
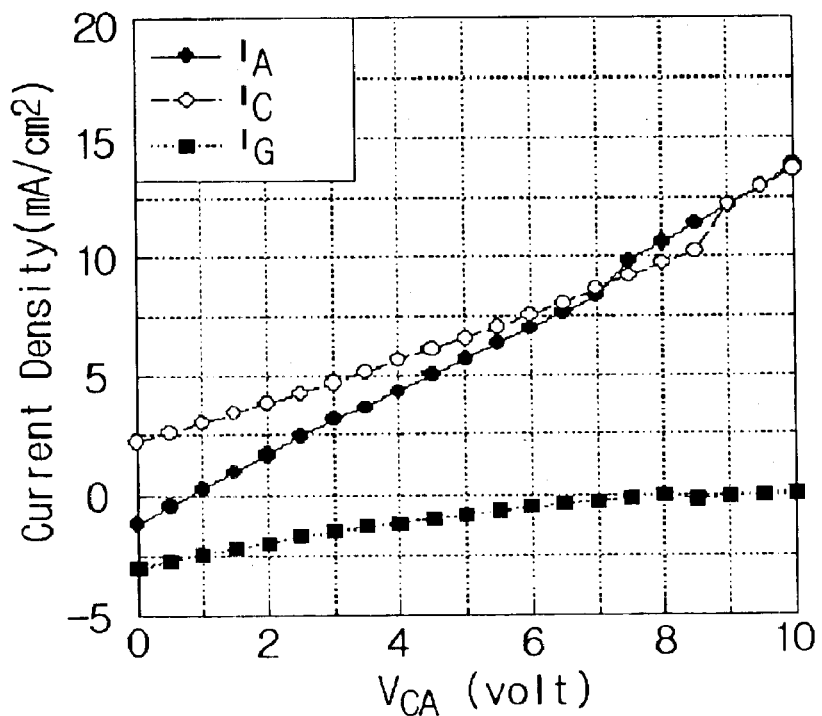
FIG. 16 is a graph showing current vs. voltage curves for ($I_A$ vs. $V_{CA}$), ($I_C$ vs. $V_{CA}$), and ($I_G$ vs. $V_{CA}$) at $V_{CG}$=3V for the three-terminal organic EL device in FIG. 14.

FIG. 16 illustrates a graph showing current vs. voltage (J-V) curves of ($I_A$ vs. $V_{CA}$), ($I_C$ vs. $V_{CA}$), and ($I_G$ vs. $V_{CA}$) at $V_{CG}=3V$ for the three-terminal organic EL device in FIG. 14. The behaviors of $I_A$, $I_C$, and $I_G$ vs. $V_{CA}$ at $V_{CG}=3V$ are very different from those at $V_{CG}=0V$ shown in FIG. 15. Shown in FIG. 16, even $V_{CA}=0V$, the currents of $I_A$, $I_C$, and $I_G$ is not 0 mA/cm². As the voltage $V_{CA}$ increases, the current $I_G$ of the third electrode gradually increases from a negative value, while the current $I_C$ of the cathode gradually increases from a positive value at $V_{CA}=0V$. The current $I_A$ of the anode gradually increases from a negative value at $V_{CA}=0V$, as the voltage $V_{CA}$ increases. Near $V_{CA}=1V$, the current $I_A$ changes its sign to positive. The numeral values of currents $I_A$, $I_C$, and $I_G$ shown in FIG. 16 are summarized in table 6.

TABLE 6

| | mA/cm² | | | |
|---|---|---|---|---|
| $V_{CA}(V)$ | $I_A$ | $I_C$ | $I_G$ | $I_C + I_G$ |
| 0.0 | −1.1 | 2.3 | −3.0 | −0.7 |
| 1.0 | 0.3 | 3.0 | −2.4 | 0.6 |
| 2.0 | 1.7 | 3.9 | −1.9 | 2.0 |
| 3.0 | 3.2 | 4.7 | −1.5 | 3.2 |
| 4.0 | 4.3 | 5.6 | −1.1 | 4.5 |
| 5.0 | 5.7 | 6.6 | −0.8 | 5.8 |
| 6.0 | 7.0 | 7.5 | −0.5 | 7.0 |
| 7.0 | 8.3 | 8.6 | −0.2 | 8.4 |
| 8.0 | 10.6 | 9.7 | −0.1 | 9.6 |
| 9.0 | 12.1 | 12.2 | −0.1 | 12.1 |
| 10.0 | 13.8 | 13.6 | −0.1 | 13.5 |

As shown in the table 6, one can again confirm that the relation of currents $I_A$, $I_C$, and $I_G$ is $I_A = I_C + I_G$ with $I_C > 0$, $I_G < 0$, and $I_A$ changing its sign from negative to positive as increasing $V_{CA}$, which is also predicted in energy diagrams of T'5 and T'6 in FIG. 4d. Thus, with referring to FIGS. 15 and 16 together with Tables 5 and 6, it is demonstrated that the organic EL device of FIG. 14 functions as a three-terminal organic EL device, in which the current flows among the anode, the cathode, and third electrode can be controlled by the adjustment of voltage applied to the third electrode.

Figure 17A:
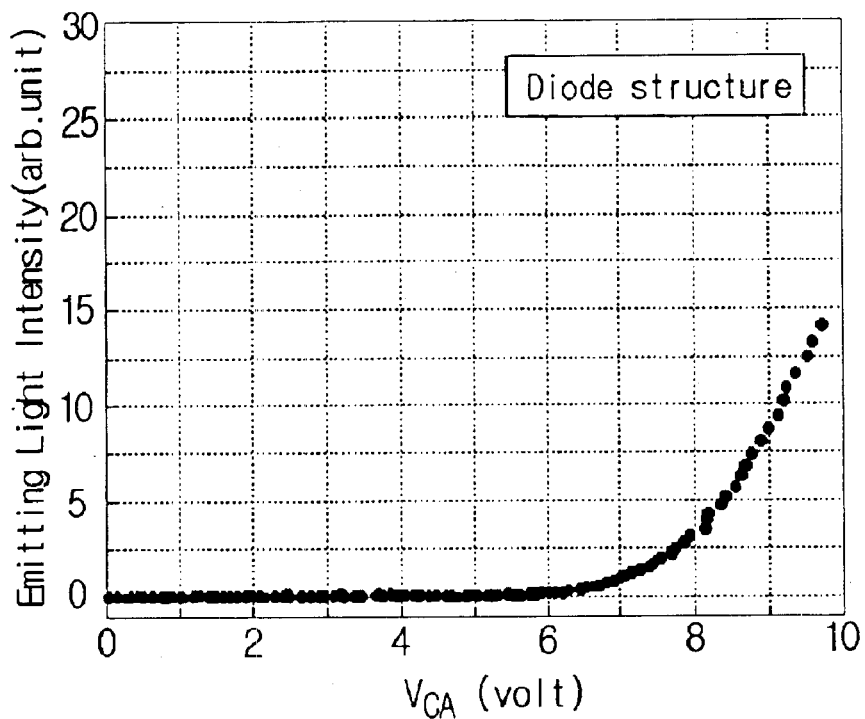
FIG. 17a is a graph showing emitting light intensity vs. voltage ($V_{CA}$) curves of the EL device in FIG. 14, wherein the third electrode is disconnected from the external electric circuit and thus the device is operated as a conventional two-terminal organic EL diode.
Figure 17B:
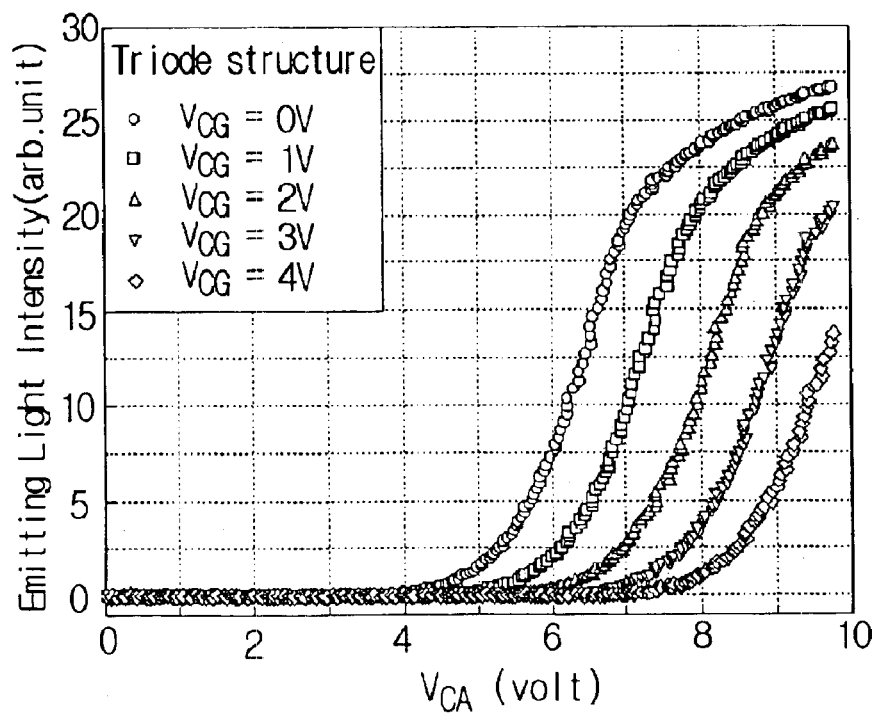
FIG. 17b is a graph showing emitting light intensity vs. voltage ($V_{CA}$) curves of the EL device in FIG. 14 for several different cathode-third electrode bias voltages ($V_{CG}$=0V, 1V, 2V, 3V, and 4V)

FIGS. 17a and 17b illustrate graphs showing emitting light intensity vs. voltage $V_{CA}$ (L-V) curves of the organic EL devices. FIG. 17a is a graph showing emitting light intensity vs. voltage ($V_{CA}$) (L-V) of the three-terminal organic EL device in FIG. 14 with disconnecting the third electrode from the external circuit, operating as a conventional two-terminal organic EL device. As shown in FIG. 17a, the electro-luminescence is initially generated at $V_{CA}$ of about 6V ($V_{ONSET}=6V$) and the luminescence is gradually increased as the voltage $V_{CA}$ is increased, showing a typical luminance behavior of a conventional two-terminal EL diode. Specifically, at $V_{CA}$ of about 10V, the brightness of luminance and current density reach about 420 cd/m$^2$ and 13.8 mA/cm$^2$, respectively, giving luminance efficiency of ~3.0 cd/A.

FIG. 17b is a graph showing emitting light intensity vs. voltage ($V_{CA}$) of the three-terminal organic EL device in FIG. 14 for several different cathode-third electrode bias voltages ($V_{CG}$=0V, 1V, 2V, 3V, and 4V). As shown in FIG. 17b, the turn-on voltage of $V_{CA}$ can be reduced below 5V and the luminance can be remarkably increased even at low $V_{CA}$. For example, in case of $V_{CG}$=0V, the electroluminescence is started at $V_{CA}$ Of about 4V and increased as the voltage $V_{CA}$ is increased. Specially, at $V_{CA}$=10V and $V_{CG}$=0V, the brightness of luminance and current density reach about 770 cd/m$^2$ and $I_A$=17.5 mA/cm$^2$, respectively, giving enhanced luminance efficiency of ~4.4 cd/A. It cannot be achieved from the conventional two-terminal organic EL device shown in FIG. 17a and it is the feature of the three-terminal organic EL device of the present invention.

As described above, it is demonstrated that the three-terminal organic EL device in FIG. 14 is a light-emitting structure with increased efficiency, decreased turn-on voltage, and increased brightness.

Figure 18:
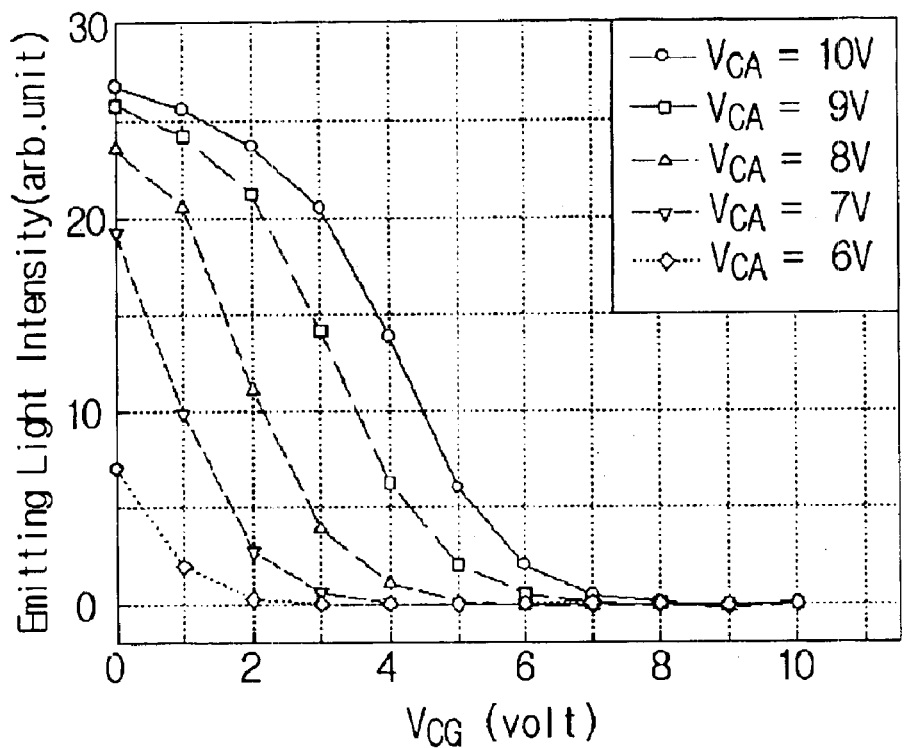
FIG. 18 is a graph showing emitting light intensity curves of the organic EL device in FIG. 14 as a function of the voltage ($V_{CG}$) for several different cathode-anode bias voltages ($V_{CA}$=6V, 7V, 8V, 9V, and 10V)

FIG. 18 is a graph showing emitting light intensity of the three-terminal organic EL device in FIG. 14 as a function of the voltage ($V_{CG}$) for several different cathode-anode bias voltages ($V_{CA}$=6V, 7V, 8V, 9V, and 10V). For a given voltage $V_{CA}$, the luminance of the organic EL device is apparently decreased as the voltage $V_{CG}$ is increased. As a result, one can again confirm that the organic EL device in FIG. 14 functions as a three-terminal device in which the luminance can be controlled by the adjustment of voltage applied to the third electrode even though the voltage $V_{CA}$ is fixed.

Figure 19A:
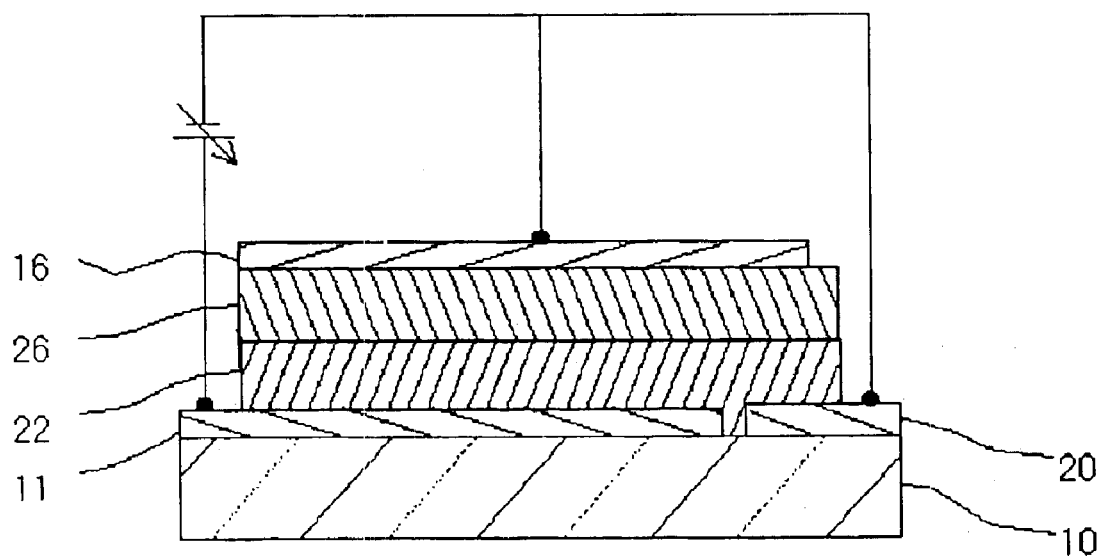
FIG. 19a is a schematic, not-to-scale cross sectional view of a three-terminal organic EL device in FIG. 14, operating at $V_{CA}$=$V_{GA}$.
Figure 19B:
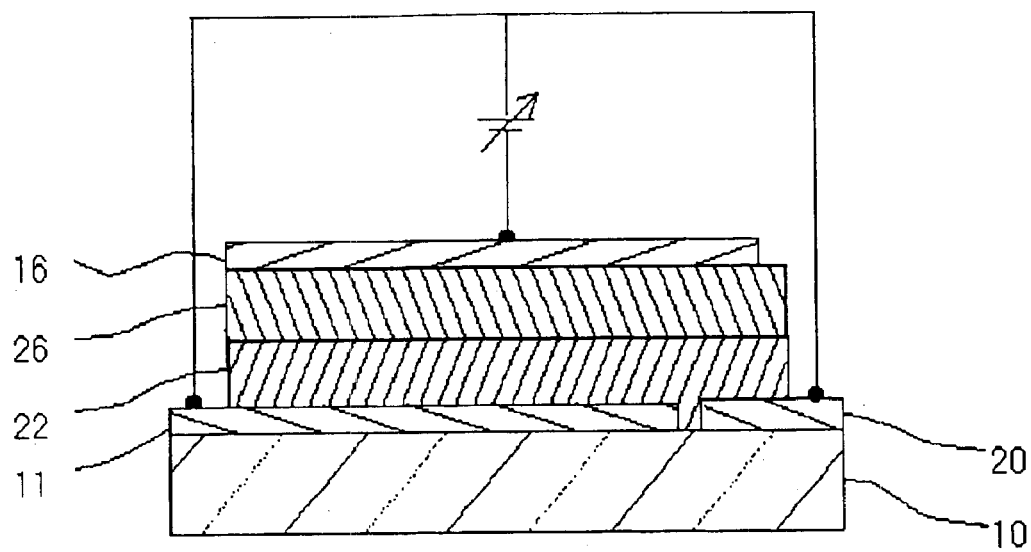
FIG. 19b is a cross sectional view of a three-terminal organic EL device in FIG. 14, operating at $V_{CA}$=$V_{CG}$.
Figure 20:
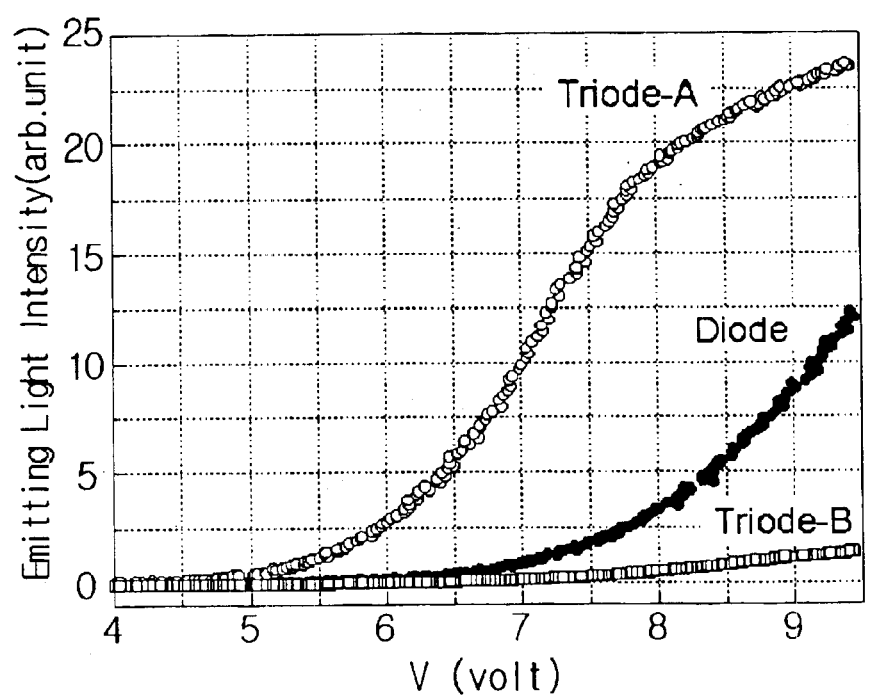
FIG. 20 is a graph showing emitting light intensity vs. applied voltage curves of the devices in FIGS. 19a ("Triode-A") and 19b ("Triode-B"), wherein the emitting light intensity vs. voltage curve ("Diode") is also shown for the EL device in FIG. 14 with disconnecting the third electrode from the external electric circuit, operating as a two-terminal organic EL device.

FIGS. 19a and 19b illustrate examples of the three-electrode organic EL device in FIG. 14, operating at $V_{CA}$= VGA and $V_{CA}=V_{CG}$, respectively. FIG. 20 is a graph showing emitting light intensity vs. applied voltage (L-V) characteristics for the three-terminal devices in FIGS. 19a ("Triode-A") and 19b ("Triode-B"). For the comparison, L-V curve ("Diode") of the organic EL device in FIG. 14 with disconnecting the third electrode from the external circuit is also shown in the figure. The emitting light intensity for "Triode-A" is remarkably increased as compared with that for "Diode". Specially, at the applied voltage of 9 V, the luminance of about 630 cd/m$^2$ for "Triode-A" is about 2.6 times brighter than that of about 300 cd/m$^2$ for "Diode". Thus, one can easily obtain the increased luminance from the "Triode-A" structure. On the contrary, the luminance of "Triode-B" is remarkably reduced as compared with that of "Diode". Therefore, one can again confirm that the organic EL device in FIG. 14 functions as a three-terminal device having increased efficiency and increased brightness according to the present invention.

Figure 21A:
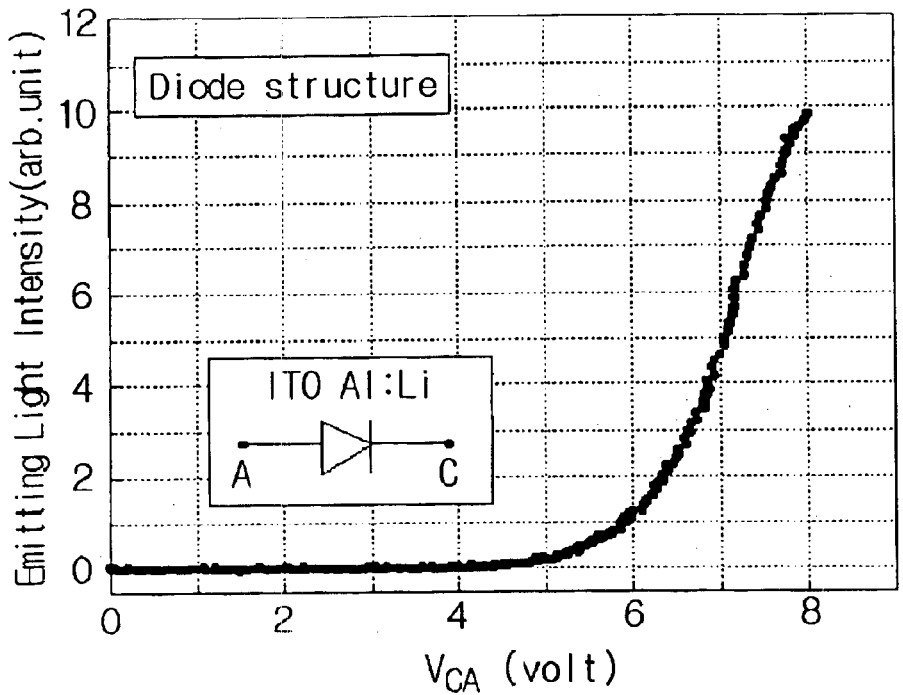
FIGS. 21a and 21b are graphs showing emitting light intensity vs. voltage ($V_{CA}$) curves of a conventional organic EL diode and coupled organic EL diodes (inset) for two different bias voltages (V=0V and 10V).
Figure 21B:
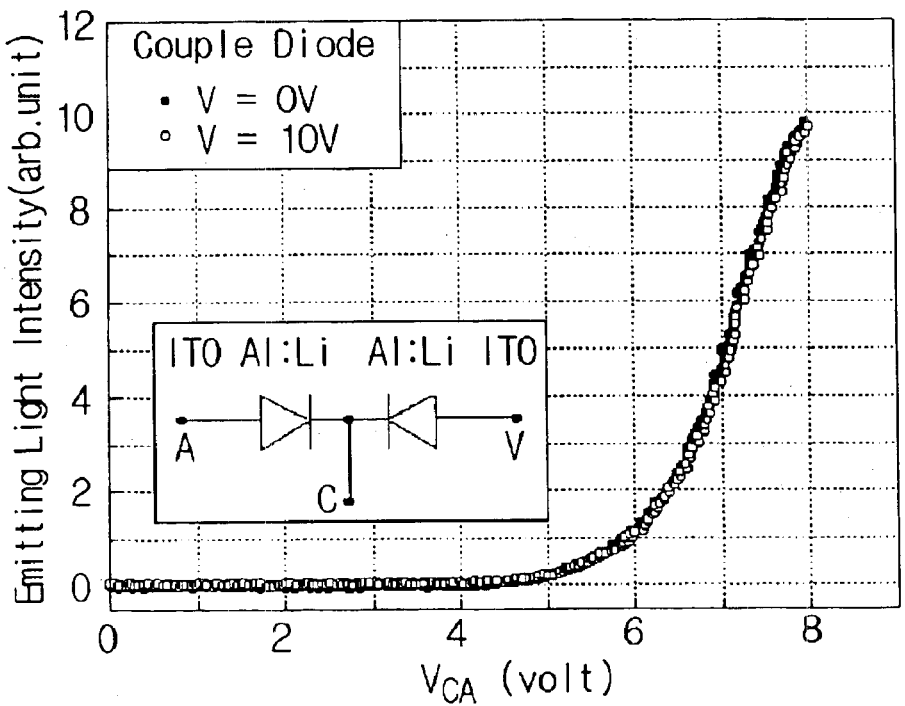

If the third electrode shown in FIG. 14 is far away from the first electrode, then the third electrode cannot control the flows of electrons and holes among the three electrodes and then the device shown in FIG. 14 is considered as a coupled organic EL diode array with a common second electrode, whose equivalent electronic circuit is shown in insets of FIG. 21. In order to distinguish the characteristics of the three-terminal organic EL device from that of the coupled organic EL diode array, a coupled organic EL diode array was fabricated by using two separated conventional organic EL diodes and L-V characteristics was investigated. The observed L-V curves of a single EL diode and the coupled organic EL diode array were shown in FIGS. 21a and 21b, respectively. In FIG. 21a, the single organic EL diode starts emitting light at about 5V showing a typical L-V characteristics of organic EL diode. FIG. 21b shows L-V curves of the coupled organic EL diode array for two different bias voltages ($V_{CG}$=0V and 10V). As shown in FIG. 21b, the turn-on voltage $V_{ONSET}$ of $V_{CA}$ does not change, and the luminance curves are identically the same as that of the single organic EL diode shown in FIG. 21a. That is, the simple coupled organic EL diode array cannot reproduce the feature of the three-terminal organic EL device according to the present invention.

The position of the third electrode is not limited so far as it can control the hole and/or electron currents inside the organic material layers. Preferably, the distance between the third electrode and the region, which is defined between the anode and the cathode, may be within 1 mm.

As described above, the three-terminal organic EL device composed of the organic light-emitting layer and the third electrode besides the anode and the cathode according to the present invention result in light-emitting structure with increased efficiency, decreased turn-on voltage, and increased brightness.

Also in a passive or an active matrix organic EL display device, reliability of image quality thereof can be enhanced by employing pixels of the three-terminal organic EL device according to the present invention.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A three-terminal organic electro-luminescent (EL) device comprising:
    a substrate;
    a first electrode formed on said substrate;
    at least one organic material layer including an organic light-emitting layer formed on said first electrode;
    a second electrode formed on said organic material layer; and
    at least one third electrode formed on or inside said organic material layer, for adjusting the injection of electrons or holes to said organic material layer from said first electrode, said second electrode, and said third electrode.

2. The three-terminal organic EL device according to claim 1, wherein the third electrode is formed outside of a region which is between said first electrode and said second electrode.

3. The three-terminal organic EL device according to claim 1, wherein the distance from said third electrode to the region which is between said first electrode and said second electrode must be provided and is less than 1 mm.

4. The three-terminal organic EL device according to claim 1, wherein each of said first electrode, said second electrode and said third electrode is made of a conductive organic material, a conductive inorganic material, a metal or complex thereof.

5. The three-terminal organic EL device according to claim 1, wherein said third electrode is made of one selected from a group consisting of ITO, Ag, Al, Mg, Ca, Li, and compound thereof.

6. The three-terminal organic EL device according to claim 1, wherein said third electrode is encapsulated by an insulating organic material or an insulating inorganic material.

7. The three-terminal organic EL device according to claim 1, wherein said third electrode is connected to an external circuit so as to have a positive or a negative potential and injection of holes and electrons into said organic material layer is controlled by the potential of said third electrode.

8. The three-terminal organic EL device according to claim 1, further comprising a hole injecting layer for injecting holes and a hole transporting layer for transporting the hole, into said organic light-emitting layer, said hole injecting layer and said hole transporting layer formed between said first electrode and said organic light-emitting layer.

9. The three-terminal organic EL device according to claim 8, further comprising an electron transporting layer for injecting and transporting electrons, into said organic material layer, said electron transporting layer formed between said second electrode and said organic light-emitting layer.

10. The three-terminal organic EL device according to claim 8, wherein said third electrode is formed on said hole injecting layer or said hole transporting layer, or formed inside said hole injecting layer or said hole transporting layer.

11. The three-terminal organic EL device according to claim 9, wherein said third electrode is formed on said organic light-emitting layer or said electron transporting layer or formed inside said organic light-emitting layer or said electron transporting layer.

12. The three-terminal organic EL device according to claim 1, wherein said organic light-emitting layer is made of an organic monomer, oligomer or polymer, which is conductive, non-conductive or semi-conductive.

13. The three-terminal organic EL device according to claim 1, wherein said substrate is made of a transparent glass, silicon or gallium arsenide.

* * * * *